(12) United States Patent
Wu et al.

(10) Patent No.: US 11,888,454 B2
(45) Date of Patent: Jan. 30, 2024

(54) BLOCKING SIGNAL CANCELLATION LOW NOISE AMPLIFIER SYSTEM

(71) Applicant: THE CHINESE UNIVERSITY OF HONG KONG, SHENZHEN, Shenzhen (CN)

(72) Inventors: Liang Wu, Shenzhen (CN); Yifu Li, Shenzhen (CN); Xiaoping Wu, Shenzhen (CN); Shiyuan Zheng, Shenzhen (CN)

(73) Assignee: THE CHINESE UNIVERSITY OF HONG KONG, SHENZHEN, Shenzhen (CN)

( * ) Notice: Subject to any disclaimer, the term of this patent is extended or adjusted under 35 U.S.C. 154(b) by 0 days.

(21) Appl. No.: 18/034,085

(22) PCT Filed: Jul. 20, 2021

(86) PCT No.: PCT/CN2021/107325
§ 371 (c)(1),
(2) Date: Apr. 27, 2023

(87) PCT Pub. No.: WO2023/000164
PCT Pub. Date: Jan. 26, 2023

(65) Prior Publication Data
US 2023/0353104 A1    Nov. 2, 2023

(51) Int. Cl.
*H03F 1/22* (2006.01)
*H03F 3/195* (2006.01)
*H03F 1/26* (2006.01)

(52) U.S. Cl.
CPC ............ *H03F 3/195* (2013.01); *H03F 1/26* (2013.01); *H03F 2200/294* (2013.01); *H03F 2200/451* (2013.01)

(58) Field of Classification Search
CPC ........................................................ H03F 1/22
(Continued)

(56) References Cited

U.S. PATENT DOCUMENTS

| 7,973,602 B2 * | 7/2011 | Shivaram | H03G 1/0035 |
| | | | 330/254 |
| 8,022,766 B2 * | 9/2011 | Dupuis | H03F 3/195 |
| | | | 330/285 |

(Continued)

FOREIGN PATENT DOCUMENTS

| CN | 105007085 A | 10/2015 |
| CN | 206294154 U | 6/2017 |

(Continued)

OTHER PUBLICATIONS

Hooman Darabi, et al., A Blocker Filtering Technique for SAW-Less Wireless Receivers, IEEE Journal of Solid-State Circuits, 2007, pp. 2766-2773, vol. 42, No. 12.

(Continued)

*Primary Examiner* — Henry Choe
(74) *Attorney, Agent, or Firm* — Bayramoglu Law Offices LLC

(57) ABSTRACT

A blocking signal cancellation low noise amplifier system includes a first low noise amplifier, a second low noise amplifier, a blocking signal extraction and bias generation circuit, a bias switching circuit, and a bias switching signal generating circuit. The first low noise amplifier is used for dynamic input matching, and the first low noise amplifier receives an input signal and outputs it after amplifying. The blocking signal extraction and bias generation circuit is used to extract a blocking signal from the output signal of the first low noise amplifier, and output a DC voltage signal. The bias switching circuit is used to switch the first low noise amplifier between a blocking mode and a small signal mode. The bias switching signal generating circuit is used to (Continued)

compare the DC bias voltage signal $V_{B2}$ with a preset reference voltage signal $V_{ref}$.

18 Claims, 15 Drawing Sheets

(58) Field of Classification Search
USPC .................................................. 330/279, 310
See application file for complete search history.

(56) References Cited

U.S. PATENT DOCUMENTS

| 8,035,443 | B2* | 10/2011 | Narathong | H03F 1/3241 |
| | | | | 330/296 |
| 8,115,547 | B2* | 2/2012 | Belot | H03F 3/68 |
| | | | | 330/136 |
| 8,471,628 | B2* | 6/2013 | Ryat | H03G 3/348 |
| | | | | 330/296 |
| 8,508,302 | B2* | 8/2013 | Fujita | H03K 19/0019 |
| | | | | 330/98 |
| 8,531,240 | B2* | 9/2013 | Ubbesen | H03G 3/3047 |
| | | | | 330/297 |
| 8,994,455 | B2* | 3/2015 | Kim | H03F 3/19 |
| | | | | 330/207 P |
| 2018/0048345 | A1 | 2/2018 | Pehlke et al. | |

FOREIGN PATENT DOCUMENTS

| CN | 106982040 A | 7/2017 |
| CN | 107026665 A | 8/2017 |

OTHER PUBLICATIONS

Shahrzad Tadjpour, et al., A 900-MHz Dual-Conversion Low-IF GSM Receiver in 0.35-μm CMOS, IEEE Journal of Solid-State Circuits, 2001, pp. 1992-2002, vol. 36, No. 12.

Kare T. Christensen, et al., A High Dynamic Range Programmable CMOS Front-End Filter with a Tuning Range from 1850 to 2400 MHz, Analog Integrated Circuits and Signal Processing, 2005, pp. 55-64, vol. 42.

Dirk Bormann, et al., A comparison of bandwidth setting concepts for Q-enhanced LC-tanks in a deep-sub micron CMOS processes, IEEE, 2008, pp. 726-729.

Hooman Darabi, A Blocker Filtering Technique for Wireless Receivers, IEEE International Solid-State Circuits Conference, Session 4, 2007, pp. 84-85, 588.

Aminghasem Safarian, et al., Integrated Blocker Filtering RF Front Ends, IEEE Radio Frequency Integrated Circuits Symposium, 2007, pp. 13-16.

Tobias D. Werth, et al., An Active Feedback Interference Cancellation Technique for Blocker Filtering in RF Receiver Front-Ends, IEEE Journal of Solid-State Circuits, 2010, pp. 989-997, vol. 45, No. 5.

Mohyee Mikhemar, et al., A Phase-Noise and Spur Filtering Technique Using Reciprocal-Mixing Cancellation, IEEE International Solid-State Circuits Conference, Session 5, 2013, pp. 86-87, 3.

Masoud Meghdadi, et al., A Highly Linear Dual-Gain CMOS Low-Noise Amplifier for X-Band, IEEE Transactions on Circuits and Systems—II: Express Briefs, 2018, pp. 1604-1608, vol. 65, No. 11.

* cited by examiner

|   | Reference |
|---|---|
| 1 | A Blocking Filtering Technique for SAW-Free Wireless Receivers |
| 2 | A 900MHz double-conversion low-IF GSM receiver using 0.35um CMOS |
| 3 | A High Dynamic Range Programmable CMOS Front-End Filter with 1850 to 1400MHz Tuning Range |
| 4 | Comparison of Bandwidth Setting Concepts for Q-Enhanced LC Trenches in a Sub-Deep Micron CMOS Process |
| 5 | A Blocking Filtering Technique for Wireless Receivers |
| 6 | An Integrated Blocking Filter RF Front-End |
| 7 | An Active Feedback Blocking Elimination Technique for Front-End Blocking Filtering in RF Receivers |
| 8 | A Phase Noise and Spur Filtering Technique Using Reciprocal Mixing Cancellation |

FIG. 1 (Prior Art)

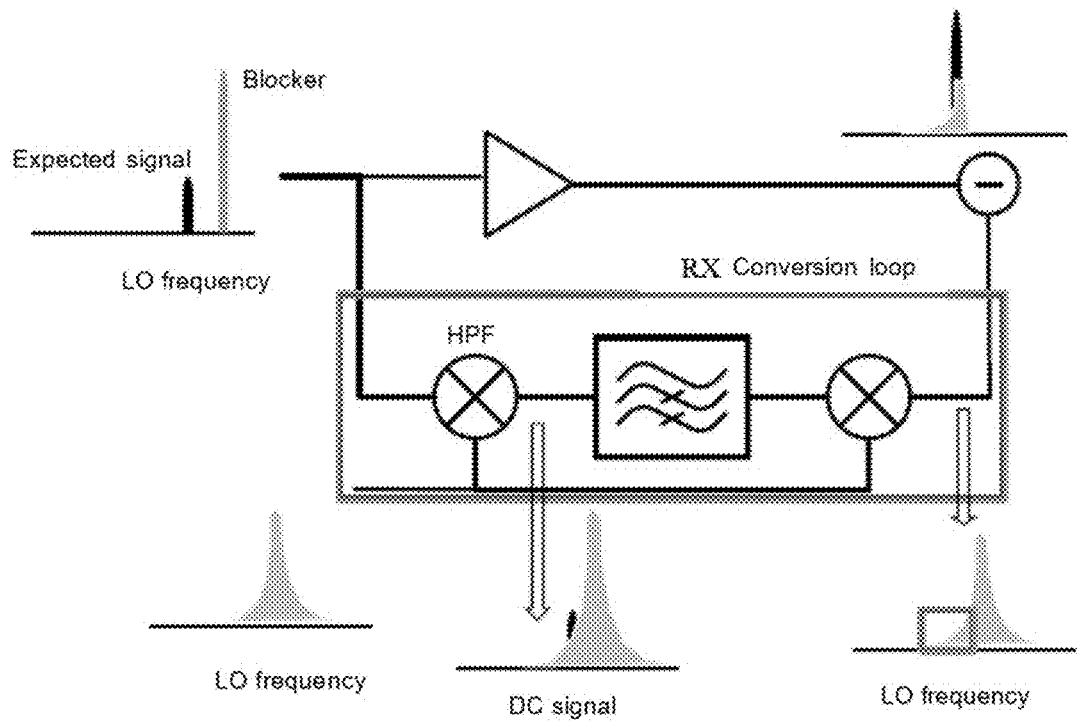

FIG. 2 (Prior Art)

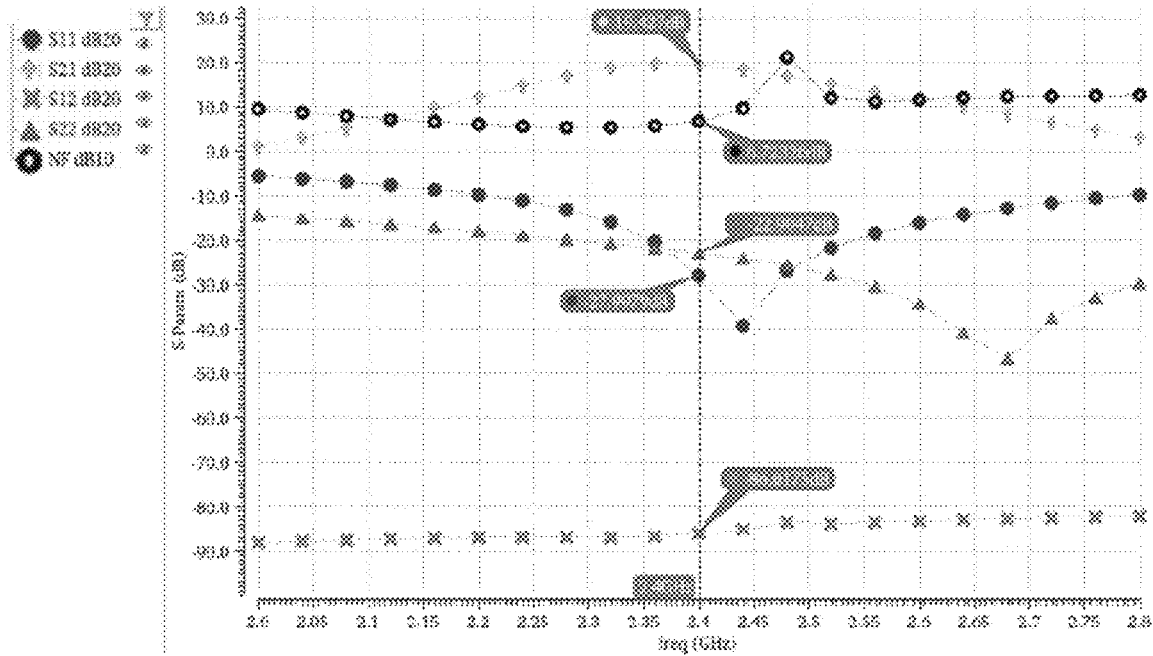

FIG. 22

| Reference | This invention | | JSSC07ª (Reference 1) | | JSSC10ª,ᵇ (Reference 7) | | ISSCCᵇ,ᶜ,ᵈ (Reference 8) | |
|---|---|---|---|---|---|---|---|---|
| Status | Blocker-cancel | Small signal | Blocker-cancel | Small signal | Blocker-cancel | Small signal | Blocker-cancel | Small signal |
| Technology | 65nm | | 65nm | | 65nm | | 40nm | |
| Supply[V] | 1.2 | | 1.2/2.5 | | 2.5 | | 1.5 | |
| Frequency [GHz] | 2.4 | | 1.96 | | 1.9 | | 2.3 | |
| Blocker [power@offset] | -15/-10 dBm@80MHz | | -10dBm@80MHz | | -15/-10 dBm@80MHz | | -15dBm@20MHz | |
| Power[mW] | 27.6/30 | 20.4-24 | >34.8 | >9.8 | 375 | 60 | >12 | |
| Gain[dB] | 24.4/19.4 | 27-33 | 21.3 | 23.5 | 19.5/18 | 24.7 | N.A. | |
| NF [dB] | 5.75/6.72 | 2.54 | 5.8 | 3.5 | 9/10 | 7 | 9.5 | 2.4 |
| S11[dB] | <-10 | <-10 | <-10 | <-10 | N.A. | N.A. | N.A. | |
| S22[dB] | <-10 | <-10 | - | - | N.A. | N.A. | - | |
| P1dB[dBm] | -18/-15 | <-33.2 | N.A. | -6.8 | N.A. | N.A. | N.A. | |
| Core area[mm²] | 0.53 | | 0.28 | | 1.2 | | 1.4 | |
| No mutual mixing | Yes | | Yes | | NO | | Yes | |

N.A. not available  – not applicable  ª with output power  ᵇ measurement data  ᶜ without output driver  ᵈ data only in baseband

FIG. 23

BLOCKING SIGNAL CANCELLATION LOW NOISE AMPLIFIER SYSTEM

CROSS REFERENCE TO THE RELATED APPLICATIONS

This application is the national phase entry of International Application No. PCT/CN2021/107325, filed on Jul. 20, 2021, the entire contents of which are incorporated herein by reference.

TECHNICAL FIELD

The present invention relates to a blocking signal cancellation low noise amplifier system.

BACKGROUND

The integration of multi-protocol, multi-band on-chip transceivers makes the design of receiver chains extremely attractive and challenging. In crowded frequency bands such as the Personal Communications Service (PCS) band at 1.93-1.99 GHz and the ISM band (Industrial Scientific Medical Band) at 2.4-2.4835 GHz, receiver (RX) performance is very sensitive to high-power blocking signals (blocker). Therefore, receivers designed for each communication standard need to meet the corresponding blocking tolerance standard, which usually contains the maximum blocking power that the receiver can accept at a certain frequency offset.

SUMMARY

The present invention mainly provides a blocking signal-canceling low-noise amplifier system, as specified below.

In one embodiment, a blocking signal canceling low noise amplifier system is provided, comprising a first low-noise amplifier, a second low-noise amplifier, a blocking signal extraction and bias generation circuit, a bias switching circuit, and a bias switching signal generation circuit.

The first low-noise amplifier for dynamic input matching, which receives the input signal for amplification and then outputs it. said first low-noise amplifier having a blocking mode and a small-signal mode, in said small-signal mode, said first low-noise In said small signal mode, the bias signal of said first low-noise amplifier is the DC bias voltage signal $V_{B1}$, and in said blocking mode, the bias signal of said first low-noise amplifier is the DC bias voltage signal $V_{B1}$. in said blocking mode, the bias signal of said first low-noise amplifier is the DC bias voltage signal $V_{B2}$.

The blocking signal extraction and bias generation circuit for extracting from the output signal of said first low-noise amplifier extracting a blocking signal from the output signal of said first low-noise amplifier and outputting a DC voltage signal in inverse relation to the strength of the blocking signal to be used as said DC bias voltage signal $V_{B2}$.

The bias switching circuit is used to switch the first low noise amplifier between the blocking mode and the small signal mode; the bias switching circuit switches the bias signal of the first low noise amplifier to The DC bias voltage signal $V_{B1}$ is used to switch the first low noise amplifier to the small signal mode; the bias switching circuit switches the bias signal of the first low noise amplifier to the DC biasing the voltage signal $V_{B2}$ to switch the first low noise amplifier into the blocking mode.

The bias switching signal generation circuit is used to compare said DC bias voltage signal $V_{B2}$ with a preset reference voltage signal $V_{ref}$. When the DC bias voltage signal $V_{B2}$ is less than the reference voltage signal $V_{ref}$, the bias switching signal generating circuit generates a first switching signal the bias switching signal generation circuit generates a first switching signal, the first switching signal being used to cause the bias switching circuit to switch the first switching signal is used to cause the bias switching circuit to switch or maintain the first low-noise amplifier in blocking mode; conversely, when the DC bias voltage signal $V_{B2}$ is greater than the reference voltage signal $V_{ref}$, the second switching signal is used to cause said bias switching circuit to switch or maintain the first low-noise amplifier into a small signal mode.

The second low-noise amplifier is connected to the first low-noise amplifier for being biased by both class A bias voltage $V_{BA}$ and class C bias voltage $V_{BC}$ for blocking cancellation and amplification of the output signal of the first low-noise amplifier.

In one embodiment, the first low noise amplifier includes a transistor M11, a transistor M12, a transistor M13, a transistor M14, a transistor M15, a transistor M16, an inductor L10, an inductor L11, an inductor L12, an inductor L13, a capacitor C10, a capacitor C11, and a capacitor C12, capacitor C13 and capacitor C14.

The second pole of the transistor M11 and the second pole of the transistor M12 are respectively connected to the first terminal and the second terminal of the inductor L13, and the third terminal of the inductor L13 is grounded; the control pole and the second pole of the transistor M11 are connected with a The capacitor C11, the control pole of the transistor M11 is also used to connect the positive terminal of the input signal of the first low-noise amplifier through the inductor L11; the control pole of the transistor M11 is also connected with the first pole of the transistor M15 through the capacitor C13, and the transistor M15 The second pole is grounded; a capacitor C12 is connected between the control pole and the second pole of the transistor M12, and the control pole of the transistor M12 is also used to connect the negative terminal of the input signal of the first low-noise amplifier through the inductor L12; the transistor M12 The control electrode is also connected to the first pole of the transistor M16 through the capacitor C14, and the second pole of the transistor M16 is grounded; The second pole of the transistor M13 is connected to the first pole of the transistor M11; the control of the transistor M13 is connected to the control pole of the transistor M14, and is used to receive the voltage signal $V_{CAS1}$; the first pole of the transistor M13 is connected to one end of the capacitor C10, the other end of the capacitor C10 is connected to the first pole of the transistor M14; the first pole of the transistor M13 is also connected to the first end of the inductor L10, the second end of the inductor L10 is connected to the first pole of the transistor M14, and the first pole of the inductor L10 The three terminals are used to receive the working voltage $V_{DD}$; the second pole of the transistor M14 is connected to the first pole of the transistor M12; The control electrode of the transistor M11 also receives the DC bias voltage signal $V_{B1}$ or the DC bias voltage signal $V_{B2}$ through the bias switching circuit; the control electrode of the transistor M12 also receives the DC bias voltage signal $V_{B2}$ through the bias switching circuit The DC bias voltage signal $V_{B1}$ or the DC bias voltage signal $V_{B2}$; wherein, the first switching signal includes the control voltage $V_{EN}$ of the first state and the control voltage $V_{blk}$ of the second state, when the first state is received When switching signals, the bias switching circuit responds to the control voltage $V_{EN}$ of the first state to disconnect the DC bias voltage signal $V_{B1}$ from the control electrode of the transistor M11, and responds to the control voltage $V_{EN}$ of the second state The control voltage $V_{blk}$ connects the DC bias voltage signal $V_{B2}$ to the control electrode of the transistor M11; the second switching signal includes the control voltage $V_{EN}$ in the second state and the control voltage $V_{blk}$ in the first state. When the second switching signal is used, the bias switching circuit connects the DC bias voltage signal $V_{B1}$ to the control electrode of the transistor M11 in response to the control voltage $V_{EN}$ in the second state, and responds to the first The control voltage $V_{blk}$ of a state disconnects the DC bias voltage signal $V_{B2}$ from the control electrode of the transistor M11; the control electrodes of the transistor M15 and the transistor M16 are also used to receive the control voltage $V_{EN}$;

The first pole of the transistor M13 and the first pole of the transistor M14 serve as the negative terminal and the positive terminal of the output of the first low noise amplifier respectively.

In the embodiment, the transistor M11 and the transistor M12 are transistors with the same parameter; the transistor M13 and the transistor M14 are transistors with the same parameter; the transistor M15 and the transistor M16 are transistors with the same parameter; the inductor L11 and the inductor L12 is an inductor with the same parameter; the capacitor C11 and capacitor C12 are capacitors with the same parameter; and the capacitor C13 and capacitor C14 are capacitors with the same parameter.

In the embodiment, the first state is low level, and the second state is high level.

In the embodiment, the second low noise amplifier includes a transistor M21, a transistor M22, a transistor M23, a transistor M24, a transistor M25, a transistor M26, an inductor L20, an inductor L21, an inductor L22, an inductor L23, an inductor L24, a capacitor C20, and a capacitor C21, capacitor C22, capacitor C23 and capacitor C24;

The first pole of the transistor M21 is connected to the first pole of the transistor M24, the second pole of the transistor M21 is grounded, and the control pole of the transistor M21 also receives the class C bias voltage $V_{BC}$ through the inductor L21; One end of the capacitor C21 is connected, the other end of the capacitor C21 is connected to one end of the capacitor C23, the other end of the capacitor C23 is connected to the control electrode of the transistor M23, and the control electrode of the transistor M23 also receives the class A bias voltage $V_{BA}$ through the inductor L23; The second pole of the transistor M23 is grounded; the end where the capacitor C21 is connected to the capacitor C23 is also used as the negative end of the second low noise amplifier input;

The first pole of the transistor M22 is connected to the first pole of the transistor M23, the second pole of the transistor M22 is grounded, and the control pole of the transistor M22 also receives the class C bias voltage $V_{BC}$ through the inductor L22; One end of the capacitor C22 is connected, the other end of the capacitor C22 is connected to one end of the capacitor C24, the other end of the capacitor C24 is connected to the control electrode of the transistor M24, and the control electrode of the transistor M24 also receives the class A bias voltage $V_{BA}$ through the inductor L24; The second pole of the transistor M24 is grounded; the end where the capacitor C22 is connected to the capacitor C24 is also used as the positive terminal of the second low noise amplifier input;

The second pole of the transistor M25 is connected to the first pole of the transistor M21; the control of the transistor M25 is connected to the control pole of the transistor M26, and is used to receive the voltage signal $V_{CAS2}$; the first pole of the transistor M25 is connected to one end of the capacitor C20, the other end of the capacitor C20 is connected to the first pole of the transistor M26; the first pole of the transistor M25 is also connected to the first end of the inductance L20, the second end of the inductance L20 is connected to the first pole of the transistor M26, and the first pole of the inductance L20 The three terminals are used to receive the working voltage $V_{DD}$; the second pole of the transistor M26 is connected to the first pole of the transistor M22;

The first pole of the transistor M25 and the first pole of the transistor M26 serve as the negative terminal and the positive terminal of the output of the second low noise amplifier respectively.

In the embodiment, the transistor M21 and the transistor M22 are transistors with the same parameter; the transistor M23 and the transistor M24 are transistors with the same parameter; the transistor M25 and the transistor M26 are transistors with the same parameter; the inductor L21 and the inductor L22 is an inductor with the same parameter; the inductor L23 and the inductor L24 are inductors with the same parameter; the capacitor C21 and capacitor C22 are capacitors with the same parameter; and the capacitor C23 and capacitor C24 are capacitors with the same parameter.

In the embodiment, the blocking signal extraction and bias generation circuit includes an envelope detection circuit and a DC signal extraction circuit;

The envelope detection circuit detects the envelope of the output signal of the first low noise amplifier, and outputs a signal that is inversely related to the magnitude of the envelope;

The DC signal extraction circuit is used to extract a DC voltage signal from the output signal of the envelope detection circuit as the DC bias voltage signal $V_{B2}$.

In the embodiment, the envelope detection circuit includes a transistor M30, a transistor M31, a transistor M32, an inductor L31, an inductor L32, a capacitor C31, and a capacitor C32;

The first pole of the transistor M31 is connected to the first pole of the transistor M32, the second pole of the transistor M31 is grounded, and the control pole of the transistor M31 also receives the bias voltage $V_{th1}$ through the inductor L31; the control pole of the transistor M31 is connected to one end of the capacitor C31 connected, the other end of the capacitor C31 is used as the negative end of the input of the envelope detection circuit;

The second pole of the transistor M32 is grounded, and the control pole of the transistor M32 also receives the bias voltage Vth through the inductor L32; the control pole of the transistor M32 is connected to one end of the capacitor C32, and the other end of the capacitor C32 is used as the input of the envelope detection circuit positive end;

The first pole of the transistor M30 is connected to the first pole of the transistor M31, the second pole of the transistor M30 is used to receive the working voltage $V_{DD}$, and the control pole of the transistor M30 is used to receive the voltage $V_{Ben}$; the first pole of the transistor M31 also serves as the output terminal of the envelope detection circuit.

In the embodiment, the transistor M31 and the transistor M32 are transistors with the same parameters; the inductor L31 and the inductor L32 are inductors with the same parameters; and the capacitor C31 and the capacitor C32 are capacitors with the same parameters.

In the embodiment, the value of the bias voltage $V_{th1}$ is the value of the threshold voltage of the transistor M31; the value of the bias voltage $V_{th1}$ is the value of the threshold voltage of the transistor M32.

In the embodiment, the DC signal extraction circuit includes a low-pass filter.

In the embodiment, the bias switching signal generating circuit includes a comparator.

In the embodiment, the comparator is used to compare the DC bias voltage signal $V_{B2}$ with a preset reference voltage signal $V_{ref}$, and when the DC bias voltage signal $V_{B2}$ is smaller than the reference voltage signal $V_{ref}$, the comparator outputs a low-level control voltage $V_{EN}$ and a high-level control voltage $V_{blk}$ as the first switching signal; when the DC bias voltage signal $V_{B2}$ is greater than the reference voltage signal $V_{ref}$, the comparator A high-level control voltage $V_{EN}$ and a low-level control voltage $V_{blk}$ are output as the second switching signal.

In the embodiment, the blocking signal canceling low noise amplifier system further includes a buffer, the buffer is used to receive the output signal of the second low noise amplifier, and the output of the buffer is used as the blocking signal canceling low noise output of the amplifier system.

BRIEF DESCRIPTION OF THE DRAWINGS

FIG. 1 is the list diagram of the documents involved in this application;

FIG. 2 is a functional block diagram of the scheme involved in Document 1;

FIG. 7A is a schematic diagram of matching in blocking mode, and FIG. 7B is switched to small signal mode Matching diagram; where L1=8.3 nH (Q=12.9), C2=437fF, L2=2 nH (Q=12);

FIG. 22 is the post-simulation S parameter and NF under −10 dBm, 2.48 GHz blocking injection of an embodiment of the present application;

FIG. 23 is a tabular diagram summarizing and comparing the performance of the present application and other blocking filtering RF front-end architectures.

DETAILED DESCRIPTION OF THE EMBODIMENTS

Figure 3:
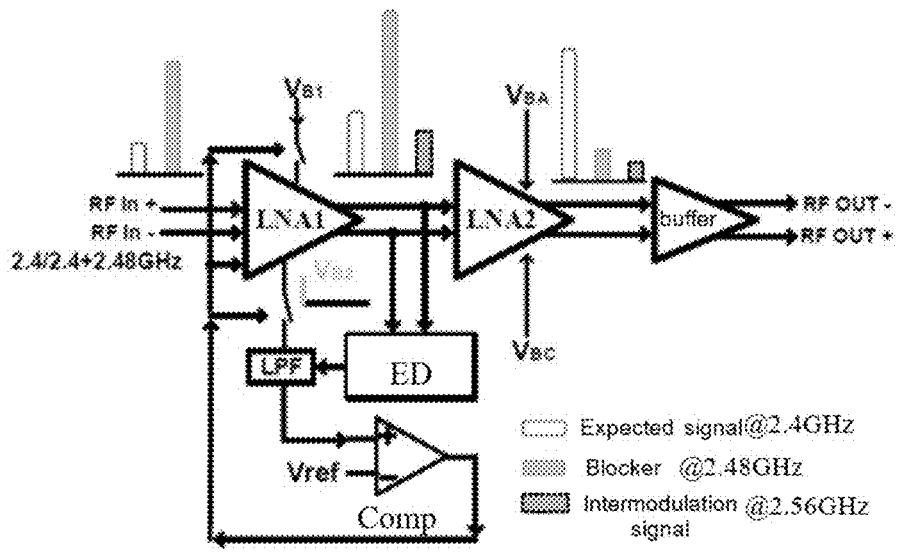
FIG. 3 is a schematic structural diagram of a blocking signal canceling low noise amplifier system according to an embodiment of the present application.

The present invention will be further described in detail below through specific embodiments in conjunction with the accompanying drawings. Wherein, similar elements in different implementations adopt associated similar element numbers. In the following implementation manners, many details are described for better understanding of the present application. However, those skilled in the art can readily recognize that some of the features can be omitted in different situations, or can be replaced by other elements, materials, and methods. In some cases, some operations related to the application are not shown or described in the description, this is to avoid the core part of the application being overwhelmed by too many descriptions, and for those skilled in the art, it is necessary to describe these operations in detail Relevant operations are not necessary, and they can fully understand the relevant operations according to the description in the specification and general technical knowledge in the field.

In addition, the characteristics, operations or characteristics described in the specification can be combined in any appropriate manner to form various embodiments. At the same time, the steps or actions in the method description can also be exchanged or adjusted in a manner obvious to those skilled in the art. Therefore, various sequences in the specification and drawings are only for clearly describing a certain embodiment, and do not mean a necessary sequence, unless otherwise stated that a certain sequence must be followed.

The serial numbers assigned to components in this document, such as "first", "second", etc., are only used to distinguish the described objects, and do not have any sequence or technical meaning. The "connection" and "connection" mentioned in this application include direct and indirect connection (connection) unless otherwise specified.

It should be noted that the transistors in this article, unless otherwise specified, can be transistors of any structure, such as bipolar transistors (BJT) or field effect transistors (FET); when the transistor is a bipolar transistor, its control The pole refers to the gate of the bipolar transistor. The first pole can be the collector or emitter of the bipolar transistor, and the corresponding second pole can be the emitter or collector of the bipolar transistor. In the actual application process, "emitter" and "collector" can be interchanged according to the signal flow direction; when the transistor is a field effect transistor, its control electrode refers to the gate of the field effect transistor, and the first electrode can be the drain or The source and the corresponding second pole can be the source or the drain of the field effect transistor. In practical application, the "source" and "drain" can be interchanged according to the signal flow direction.

Please refer to the literature table in FIG. 1, which involves the following literature:

Reference 1: A Blocking Filtering Technique for SAW-Less Wireless Receivers (H. Darabi, "A Blocker Filtering Technique for SAW-Less Wireless Receivers," in IEEE Journal of Solid-State Circuits, vol. 42, no. 12, pp. 2766-2773, December 2007);

Reference 2: A 900-MHz dual conversion low-IF GSM receiver using 0.35 um CMOS (S. Tadjpour, S. Cijvat, E. Hegazi, and A. A. Abidi, "A 900-MHz dual conversion low-IF GSM receiver in 0.35-_m CMOS," IEEE J. Solid-State Circuits, vol. 36, no. 12, pp. 1992-2002, December 2001);

Reference 3: A high dynamic range programmable CMOS front-end filter with a tuning range from 1850 to 2400 MHz (K. T. Christensen, T. H. Lee, and E. Bruun, "A high dynamic range programmable CMOS front-end filter with a tuning range from 1850 to 2400 MHz," Analog Integrated Circuits and Signal Processing, vol. 42, pp. 55-64, 2005);

Reference 4: A comparison of bandwidth setting concepts for Q-enhanced LC trenches in a deep submicron CMOS process (D. Bormann, T. D. Werth, N. Zimmermann, R. Wunderlich, and S. Heinen, "A comparison of bandwidth setting concepts for Q-enhanced LC-tanks in deep-sub micron CMOS processes," in IEEE Int. Conf. Electronics, Circuits and Systems, September 2008, pp. 726-729);

Reference 5: A blocking filtering technique for wireless receivers (H. Darabi, "A blocker filtering technique for wireless receivers," in IEEE Int. Solid-State Circuits Conf., ISSCC 2007, Dig. Tech. Papers, Feb. 11-15, 2007, pp. 84-588);

Reference 6: An Integrated Blocker Filtering RF Front End (A. Safarin, A. Shameli, A. Rofougaran, M. Rofougaran, and F. de Flaviis, "Integrated blocker filtering RF front ends," in Proc. 2007 IEEE Radio Frequency Integrated Circuits (RFIC) Symp., Jun. 3-5, 2007, pp. 13-16);

Reference 7: An Active Feedback Interference Cancellation Technique for Blocker Filtering in RF Receiver Front-Ends," in IEEE Journal of Solid-State Circuits, vol. 45, no. 5, pp. 989-997, May 2010);

Reference 8: A phase noise and spur filtering technique using reciprocal-mixing cancellation (M. Mikhemar, D. Murphy, A. Mirzaei and H. Darabi, "A phase-noise and spur filtering technique using reciprocal-mixing cancellation," 2013 IEEE International Solid-State Circuits Conference Digest of Technical Papers, 2013, pp. 86-87);

The inventor has studied these documents. Reference 1 indicates that out-of-band blockage deteriorates receiver performance mainly in the compression of gain and the increase of noise figure, while reference 2 indicates that in-band blockage may be caused by intermodulation, mutual mixing and other effects. RX desensitization. Past on-chip blocking cancellation techniques mainly include the use of quality factor (Q) enhanced band-pass filters, active cancellation in references 1 and 3, filter forward cancellation in references 5 and 6, and the use of references 6 and 6. Reference 7 uses methods such as feedback cancellation. However, reference 6 has shown that feedback cancellation is not sensitive to I/Q mismatch, and high-quality, high-selectivity filters not only have insertion loss but are also difficult to design. For the conversion loop method in reference 1, although the noise introduced by mutual mixing is suppressed by the filter, but in the blocking cancellation part, the noise of the local oscillator and the up-conversion mixer is superimposed on the received signal. The principle is shown in FIG. 2 Show. For reference 7, the mutual mixing noise introduced in active cancellation greatly deteriorates the noise figure of the RF front-end, and its power consumption exceeds 60 mW, which is difficult to meet today's low-power design requirements. Under small signal conditions, the RF front-ends of reference 1 and reference 7 can reach 3.5 dB and 7 dB at around 1.9 GHz, respectively, and their noise figures are also in a relatively high state, and phase mismatch between cancellation loops will also exist. Reference 8 uses the approximately symmetrical spectral characteristics of the oscillating signal to generate a mirrored mutual mixing noise to cancel the other polluted signal. However, the noise of this receiver will be severely limited by the noise of the other channel, and its test data is currently limited to the baseband part.

This application proposes a structure based on dynamic input matching and bias strategy to directly cancel the blocking signal of the low-noise amplifier (LNA, low-noise amplifier), which solves the mutual mixing of the passband without introducing LO and mixer. Frequency problem, thereby reducing NF. In some embodiments, the fully differential architecture enables the LNA to provide the best phase matching on the blocking cancellation path. In some embodiments, after the parameters of each device are selected, at an offset of 80 MHz, the low noise amplifier system designed in the present application can offset the blocking power of −10 dBm at most. In some embodiments of this application, a low-noise amplifier (LNA) structure that can directly cancel the blocking signal (blocker) in the time domain is proposed; the circuit adopts a two-stage structure, the first stage is responsible for dynamic input matching, and the second stage The stage is responsible for the cancellation of the blocking signal, and introduces a comparator and an envelope detector to judge the blocking signal and switch the working mode, that is, the LNA can work in the small signal mode and the blocking mode. Compared with the previous radio frequency receiver (RX) front-end technology based on blocking signal filtering in the frequency domain, this technology simplifies the RX design for overcoming blocking. At the same time, the LNA does not use signal processing filters, mixers and local oscillators in canceling blocking, thereby further reducing the introduction of noise and insertion loss, and avoiding the problem of reciprocal mixing. Dynamic matching and dynamic biasing techniques enable the LNA to ensure good input matching in dual mode and ease the phenomenon of gain compression. In addition, under the design of the fully differential structure, the strategy of canceling blocking in the time domain ensures the minimum signal phase error in the canceling process, further improving the canceling effect. This LNA adopts TSMC 65 nm process, the chip area is 0.89×0.59 mm2, and the working frequency is 2.4 GHz. In small-signal mode, the LNA has a variable gain of 27-33 dB and a 3-dB bandwidth of 180 MHz, a noise figure (NF) of 2.54 dB, and a power consumption of 20.4-24 mW at a supply voltage of 1.2V. When a −15/−10 dBm blocker at 2.48 GHz is involved, the gain of the LNA after canceling the blocker is 24.5/19.4 dB, the NF is 5.75/6.72 dB, and the power consumption is 27.6/30 mW.

Details are given below.

Some embodiments of the present application provide a blocking signal cancellation low noise amplifier system. Please refer to FIG. 3, the blocking cancellation low noise amplifier using a two-stage differential structure can provide a good virtual ground and two signal paths with a phase difference of 180 degrees. The low-noise amplifier LNA1 of the first stage has two working modes: blocking mode and small-signal mode. In blocking mode, LNA1 focuses on dynamic input matching and provides appropriate gain in order to improve the sensitivity of its output envelope detector ED to detect blocking signals. The low-pass filter LPF and the envelope detector ED cooperate to convert the detected blocking strength into a DC voltage signal $V_{B2}$ that has a certain relationship (for example, an inverse relationship) with it, and use it as the new bias voltage of LNA1 in the blocking mode, also known as dynamic bias strategy. The stronger the blocking, the smaller the value of the voltage $V_{B2}$, and the voltage $V_{B2}$ is used as the bias voltage of LNA1 in blocking mode, so it can slow down the phenomenon of blocking and saturating the transistor; at the same time, the reduced bias voltage $V_{B2}$ can also adjust the matching level The transconductance of the transistor to help improve input matching is part of the dynamic input matching function. The voltage $V_{B1}$ is the bias voltage of the LNA1 in the small signal mode, and its value is generally a constant value after the chip works stably. It should be noted that although the low-pass filter LPF is used in the design, it is only used for DC bias voltage extraction rather than signal processing, so it will not introduce insertion loss to the signal, so the blocking signal cancels the low-noise amplifier system. The entire blocking cancellation process remains filterless.

The above also involves a core issue, when LNA1 works in blocking mode, it is biased by voltage $V_{B2}$, and when LNA1 works in small signal mode, it is biased by voltage $V_{B1}$. It can be realized in this way: the voltage $V_{B2}$ is sent to the comparator Comp and the reference voltage $V_{ref}$ defined by the user to judge whether there is a blockage. The user can set the reference voltage $V_{ref}$ according to the maximum acceptable blocking sensitivity, but it will usually be higher than the value read by the voltage $V_{B2}$ at the 1 dB compression point of the amplifier. When there is strong blocking, the signal or control voltage output by the comparator will close the switch $SV_{B2}$ that connects the voltage $V_{B2}$ to the bias of LNA1, and open the switch $SV_{B1}$ that connects the voltage $V_{B1}$ to the bias of LNA1, so that LNA1 is dynamically biased by voltage $V_{B2}$. When there is no blocking, the signal or control voltage output by the comparator will disconnect the switch $SV_{B2}$ that connects the voltage $V_{B2}$ to the bias of LNA1, and close the switch $SV_{B1}$ that connects the voltage $V_{B1}$ to the bias of LNA1, so that LNA1 is biased by the voltage $V_{B1}$ place. In both operating modes, the variable input matching network in LNA1 is also changed by the switch control voltage.

The second-stage low-noise amplifier LNA2 utilizes the non-linear and linear environment generated by the differential signal path, class C bias voltage $V_{BC}$ and class A bias voltage $V_{BA}$, and realizes blocking elimination by adjusting the voltage $V_{BA}$ before the signal reaches the output load of LNA2.

The dynamic input matching and offsetting principles are analyzed below. In addition, in order to facilitate the test, a differential common-source stage (CS) driver can be added to the output of the blocking signal cancellation low-noise amplifier system designed in this application to match the 50Ω probe.

The following focuses on the research and analysis of the nonlinear effect on the input matching of the low noise amplifier system and the equivalent transconductance of the transistor, and gives the design and analysis of the dynamic input matching network and the differential blocking cancellation path.

The input matching is explained first.

Figure 4:
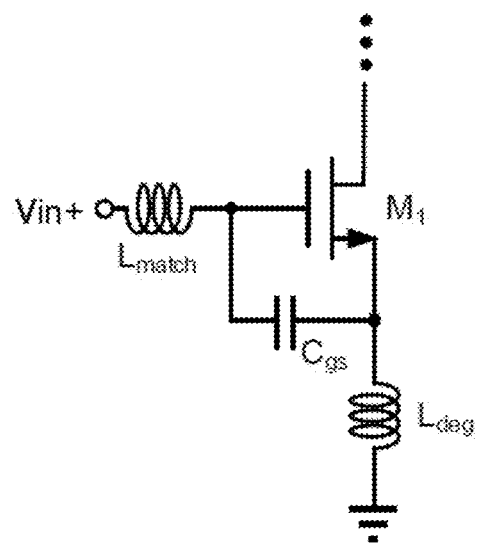
FIG. 4 is a schematic diagram of a common-source inductance degeneration matching structure of an embodiment of the present application.

This application uses the common-source inductance degeneration matching technology, which has the advantages of easy matching and low noise in narrow-band low-noise amplifiers. It is advisable to take this matching structure as the research object. FIG. 4 shows the schematic diagram of the structure, and the input impedance $Z_{in}$ under the small signal $x_1(t)=A_1 \cos(\omega_1 t)$ can be obtained as:

$$Z_{in} = \frac{1}{sC_{gs}} + s(L_{deg} + L_{match}) + \frac{g_{m1}L_{deg}}{C_{gs}} \quad (1)$$

Where $s=j\omega_1$, $g_{m1}$ is the transconductance of transistor M1 under small signal. If a blocking signal $x_2(t)=A_2 \cos(\omega_2 t)$ is mixed into the ideal signal at this time, and the amplitude $A_2$ is much larger than $A_1$, then the output current of the drain (drain terminal) of transistor M1 in FIG. 4 can be approximately expressed as $$I(t) \approx a_1(A_1 \cos(\omega_1 t) + A_2 \cos(\omega_2 t)) + a_2(A_1 \cos(\omega_1 t) + A_2 \cos(\omega_2 t))^2 + a_3(A_1 \cos(\omega_1 t) + A_2 \cos(\omega_2 t))^3 \quad (2)$$

$a_1$ is $g_{m1}$, $a_2$ and $a_3$ are the equivalent transconductance of harmonics under nonlinearity, formula (2) is an approximate analysis of the intermodulation phenomenon, and $a_1$, $a_3$ have opposite signs. Expand the formula (2) and sort it out to get the signal composition of each frequency ω as follows, where the fundamental frequency part is:

$$\omega = \omega_1, \omega_2 : \left(\alpha_1 A_1 + \frac{3}{4}\alpha_3 A_1^3 + \frac{3}{2}\alpha_3 A_1 A_2^2\right)\cos(\omega_1 t) + \\ \left(\alpha_1 A_2 + \frac{3}{4}\alpha_3 A_2^3 + \frac{3}{2}\alpha_3 A_2 A_1^2\right)\cos(\omega_2 t) \quad (3)$$

The intermodulation product is:

$$\omega = 2\omega_1 - \omega_2 : \frac{3}{4}\alpha_3 A_1^2 A_2; \quad \omega = 2\omega_2 - \omega_1 : \frac{3}{4}\alpha_3 A_1 A_2^2; \quad (4)$$

The DC product is:

$$\omega = 0 : \frac{\alpha_2(A_1^2 + A_2^2)}{2} \quad (5)$$

Since $A_2$ is much larger than $A_1$, according to formula (3), the simplified equivalent small-signal transconductance $g_{m1eq}$ of transistor M1 affected by blocking can be expressed as:

$$g_{mleq} = g_{m1} + g_{mDC} + \frac{3}{2}\alpha_3 A_2^2 \qquad (6)$$

Figure 5:
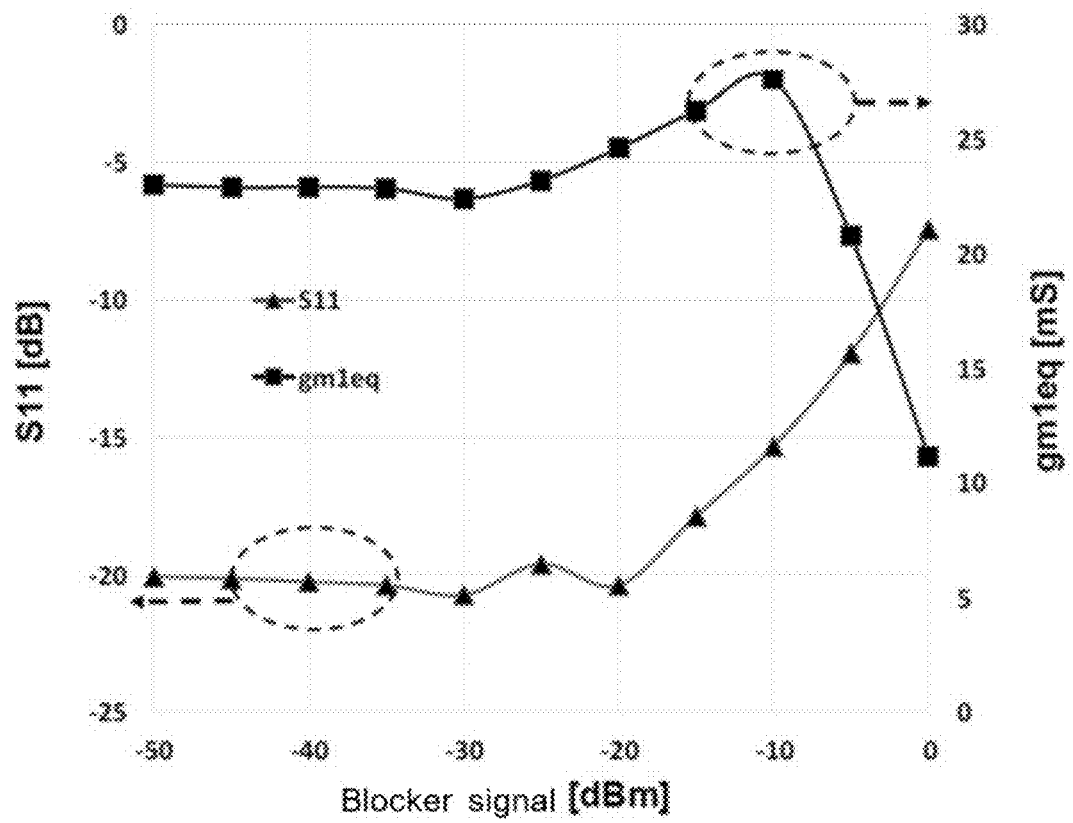
FIG. 5 is a schematic diagram of the influence of the blocking strength with a distance of 80 MHz on the input matching of the structure in FIG. 4 and the equivalent small-signal transconductance g_m1eq at a working frequency of 2.4 GHz.

In Equation (6), $g_{mDC}$ represents the additional transconductance contribution of the DC component product generated by the blocking signal to transistor M1; Equation (6) shows that if only the blocking strength is increased, the $$\frac{3}{2}\alpha_3 A_2^2$$

term will compress the transconductance, but the additional DC current product produced by equation (5) will compensate $g_{mleq}$. For parasitic capacitances in transistors, bias conditions will also dominate. Although different blocking conditions will also affect the gate-source parasitic capacitance $C_{gs}$ by introducing different nonlinear DC currents, the impact of this capacitance change on input matching at low frequencies can be approximately ignored. The above surface shows that the input matching in blocking mode is mainly determined by $g_{mleq}$. To assist the description, FIG. 5 shows the simulation results of the input matching S11 and $g_{mleq}$ under a blocking distance of 80 MHz when the structure in FIG. 4 operates at a frequency of 2.4 GHz. When the blocking strength blocker increases from −30 dBm to −10 dBm, $g_{mleq}$ increases because $g_{m1}+g_{mDC}$ DC dominates. But when the blocking power is greater than −10 dBm, $$\frac{3}{2}\alpha_3 A_2^2$$

begins to dominate $g_{mleq}$ and rapidly deteriorates the matching effect.

The design idea of the dynamic input matching network will be described below.

Figure 6:
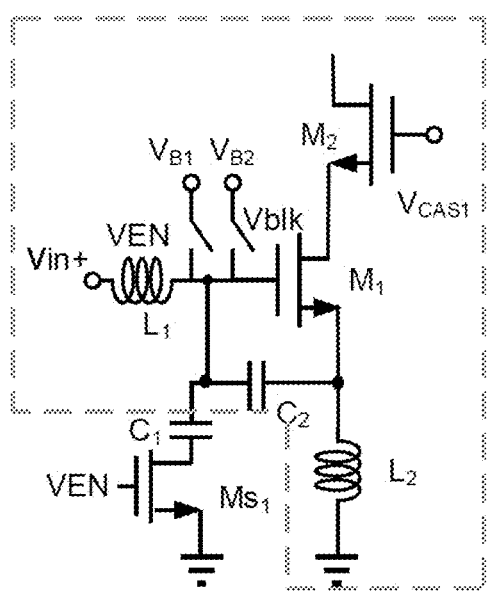
FIG. 6 is a schematic diagram of a dynamic matching network according to an embodiment of the present application.

Using the matching structure of the common-source inductance degeneration and the above-mentioned analysis of the input matching, we choose to design the matching network in the blocking mode when the blocking strength is −30 dBm to −10 dBm, and then design the matching network for small signals in the case of small signals. FIG. 6 shows the schematic of the dynamic input matching network design. The voltage $V_{B1}$ is the bias voltage in the small signal mode, and the voltage $V_{B2}$ is the dynamic bias voltage in the blocking mode; they can be controlled by the voltage control switch VEN (that is, the switch $SV_{B1}$ mentioned above) and Vblk (that is, the above-mentioned switch $SV_{B1}$) and Vblk (that is, the above-mentioned SVB2) control. Since −30 dBm to −10 dBm blockage will increase $g_{mleq}$ and $g_{m1}+g_{mDC}$ is dominant at this time, appropriately reducing the value of voltage VB2 will not only help reduce $g_{mleq}$ to calibrate input matching, but also effectively alleviate the problem of gain compression. When matching the blocking mode, the capacitor C1 and the voltage VB1 will not be connected, select the appropriate inductance and transistor parameters and scan the blocking from −30 dBm to −10 dBm to determine the appropriate dynamic voltage VB2. Match the small-signal mode after the matching is completed. After analyzing FIG. 7A and FIG. 7B, the transfer track on the Smith circle when the input resistance is switched from the matching point under blocking to the small-signal mode, we find that the capacitor C2 A switch and C1 are added, and the small signal input is matched. At this time, the input impedance of this mode can be expressed as:

$$Z_{sin} = \frac{Z_0}{1+\omega^2 C_1 Z_0} - \frac{j\omega C_1 Z_0^2}{1+\omega^2 C_1 Z_0} + j\omega L_1; \qquad (7)$$

$$Z_0 = \frac{1}{s(C_2 + C_{gs1})} + sL_2 + \frac{g_{m1}L_2}{(C_2 + C_{gs1})};$$

Figure 7A:
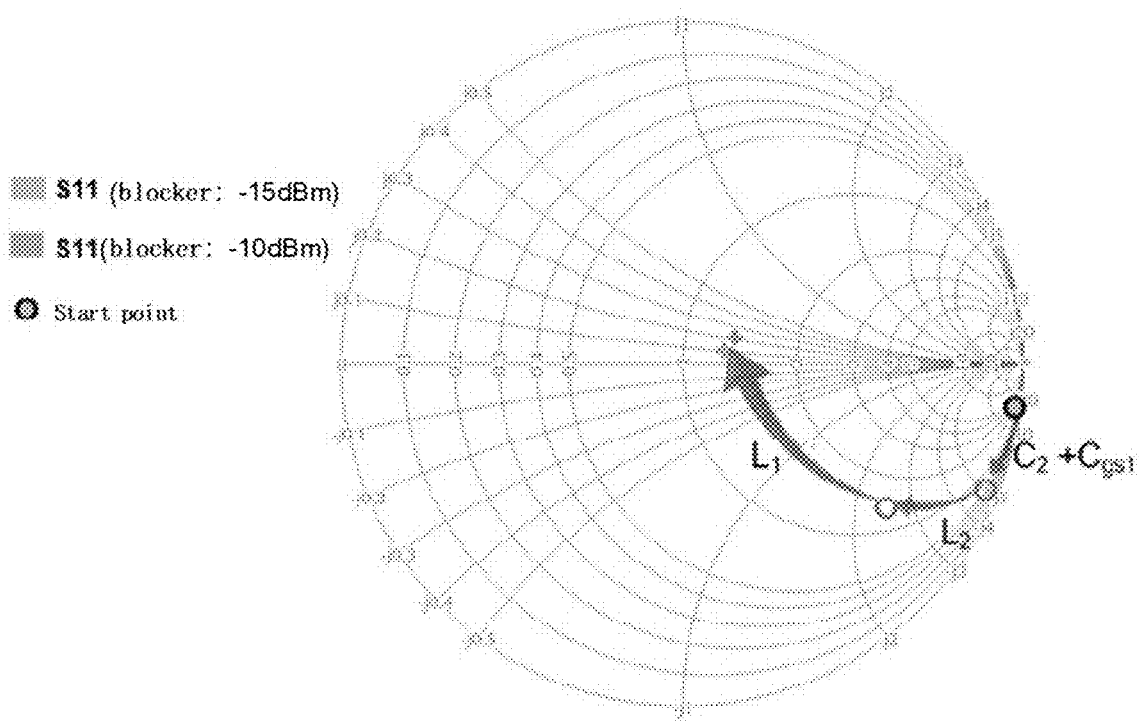
FIG. 7A and FIG. 7B are schematic diagrams of input matching simulation in some embodiments of the present application, specifically.
Figure 7B:
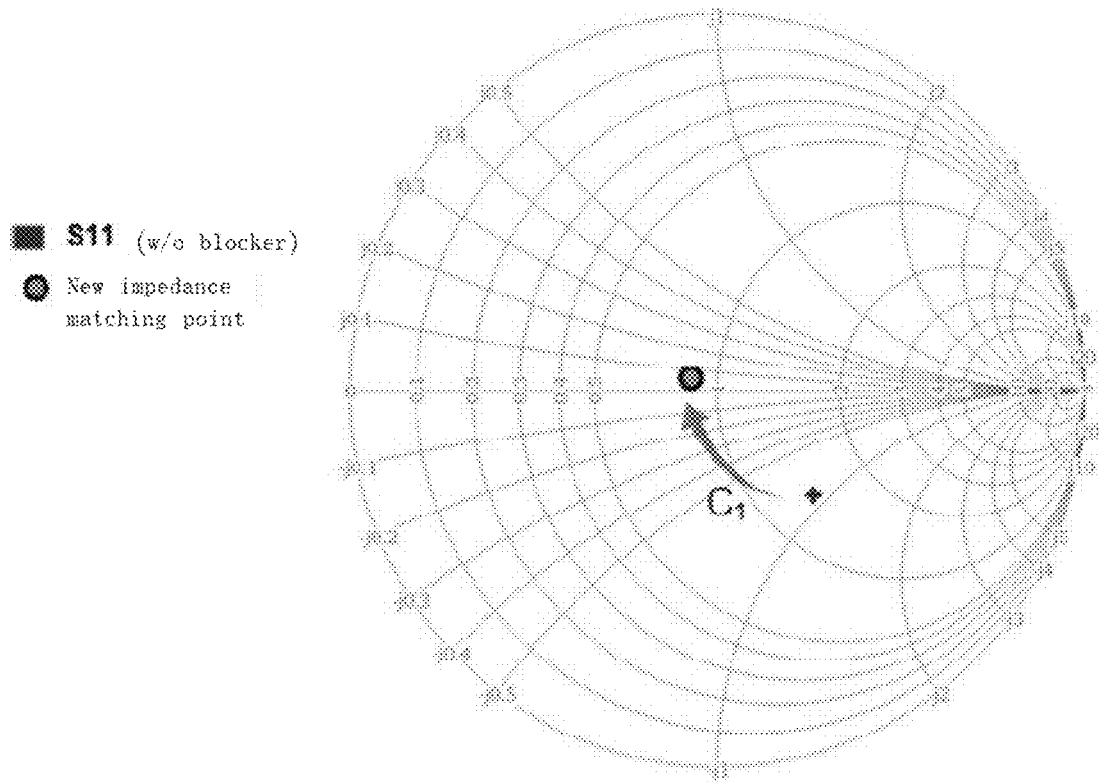

The upper cross symbol in FIG. 7A indicates the position of S11 (blocking signal: −15 dBm) in the analysis diagram, and the lower cross symbol indicates the position of S11 (blocking signal: −10 dBm) in the analysis diagram. The cross symbol in FIG. 7B indicates the position of S11 (non-blocking signal) in the analysis diagram.

Next, design and analyze the blocking offset structure.

Figure 8:
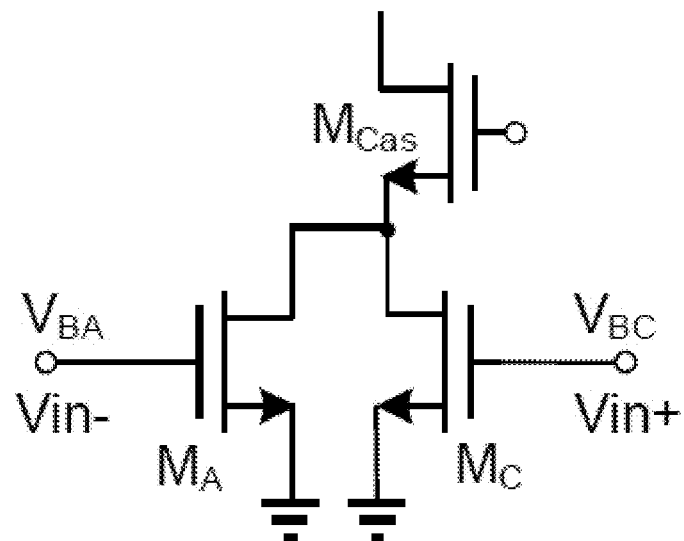
FIG. 8 is a schematic diagram of a blocking current elimination structure constructed in an embodiment of the present application.

The difference in amplifying small signals and blocking capabilities of transistors under Class A and Class C biases will be analyzed below. FIG. 8 shows a blocking current cancellation structure constructed by summing two differential signals of opposite polarity. At the load transistor $M_{Cas}$, the two AC signals are canceled, but the DC bias current is the sum of the two bias currents. For the convenience of analysis, we set the bias currents of transistor $M_A$ and transistor $M_C$ as $I_A$ and $I_C$ respectively, and the length and width of these two transistors are the same, that is, $W_A=W_C$, $L_A=L_C$. Transistor $M_A$ is biased in class A by voltage $V_{BA}$, and transistor $M_C$ is biased in class C by voltage $V_{BC}$. Define $\alpha_{iA}$ and $\alpha_{iC}$ to represent the i-th order transconductance coefficients of transistor $M_A$ and transistor $M_C$ respectively, where the value range of i is 1, 2, 3. Define $g_{jA}$ and $g_{jC}$ as the total equivalent transconductance of transistor $M_A$ and transistor $M_C$ to the signal $x_{j\ (t)}$ involved in the above input matching analysis, and the value range of i is 1, 2. Since $A_2$ is much larger than $A_1$, we can get:

$$g_{1A} = \alpha_{1A} + \frac{3}{2}\alpha_{3A}A_2^2 = \sqrt{2\mu_n C_{ox}\frac{W_A}{L_B}I_A} + \frac{3}{2}\alpha_{3A}A_2^2 \qquad (7)$$

$$g_{2A} = \alpha_{1A} + \frac{3}{4}\alpha_{3A}A_2^2 \qquad (8)$$

$$g_{1C} = \alpha_{1C} + \frac{3}{2}\alpha_{3C}A_2^2 \qquad (9)$$

$$g_{2C} = \alpha_{1C} + \frac{3}{4}\alpha_{3C}A_2^2 \qquad (10)$$

It can be known from equation (5) that the nonlinear effect will generate additional DC current to enhance the small signal transconductance, so $\alpha_{1C}$ contains $I_C$ and additional nonlinear current, and large $W_C$, $V_{BC}$ and blocking power will enhance $\alpha_{1C}$ and $\alpha_{3C}$. However, under the same conditions, the C-type bias is more nonlinear than the A-type bias, so firstly $\alpha_{1C}\neq\alpha_{1A}$ and $\alpha_{3C}\neq\alpha_{3A}$. If it is necessary to match two channels of blocking current in blocking mode, $g_{2A}=g_{2C}$ needs to be satisfied, then:

$$\alpha_{1C} - \alpha_{1A} + \frac{3}{4}(\alpha_{3C} - \alpha_{3A})A_2^2 = 0 \qquad (11)$$

At this time, the net transconductance to the small signal after canceling the blocking is:

$$g_{1C} - g_{1A} = \alpha_{1C} - \alpha_{1A} + \frac{3}{2}(\alpha_{3C} - \alpha_{3A})A_2^2 = \alpha_{1A} - \alpha_{1C} \neq 0 \quad (12)$$

In general, the inventors have utilized the differences in the small-signal and large-signal amplification capabilities of the A-type bias tube and the C-type bias tube to design a suitable blocking cancellation structure. In some cases, the establishment of formula (12) requires that the blocking strength cannot dominate the input matching, that is, $\alpha_{3A} A_2^2$ and $\alpha_{3C} A_2^2$ cannot dominate. When the blocking is within a reasonable range, the variation of $g_{jA}$ and $g_{jC}$ will be more sensitive to the variation of the bias voltage of transistor $M_A$ and transistor $M_C$. Excessive blocking strength will saturate the two transistors, and the ability of the bias voltage to control the blocking current will decrease, thereby deteriorating the offset effect. In the small-signal mode, the C-type bias circuit has a low amplification capability for small signals, and the A-bias branch works normally and can adjust the gain of the second stage of the low-noise amplifier system.

Figure 9:
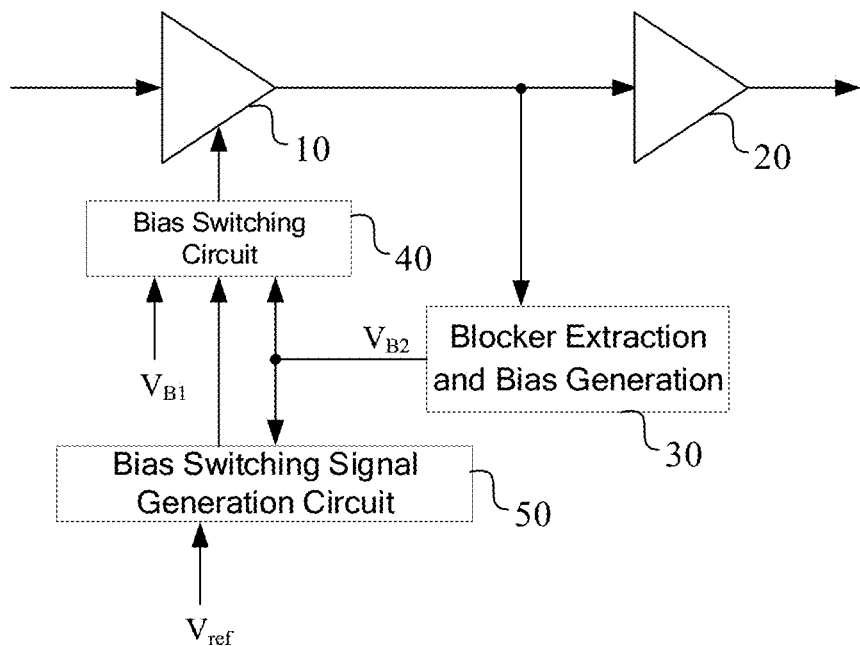
FIG. 9 is a schematic structural diagram of a blocking signal canceling low noise amplifier system according to an embodiment of the present application.

The above is the analysis of the low noise amplifier system. Based on the above analysis, this application proposes a blocking signal cancellation low noise amplifier system. Please refer to FIG. 9, the blocking signal cancellation low noise amplifier system in some embodiments includes a first low noise amplifier 10, a second low noise amplifier 20, a blocking signal extraction and bias generating circuit 30, a bias switching circuit 40, and a bias switching signal generation circuit 50 is set, which will be described in detail below.

The first low noise amplifier 10 is also referred to as low noise amplifier LNA1 for short herein. The first low noise amplifier 10 is used for dynamic input matching, it receives an input signal, amplifies it and outputs it. The first low-noise amplifier 10 has a blocking mode and a small-signal mode; specifically, in the small-signal mode, the bias signal of the first low-noise amplifier 10 is a DC bias voltage signal $V_{B1}$; In the blocking mode, the bias signal of the first low noise amplifier 10 is a DC bias voltage signal $V_{B2}$. The two operating modes of the first low noise amplifier 10 (ie blocking mode and small signal mode) can be switched autonomously and dynamically through the bias switching circuit 40 and the bias switching signal generating circuit 50, which will be described in detail below.

Figure 10A:
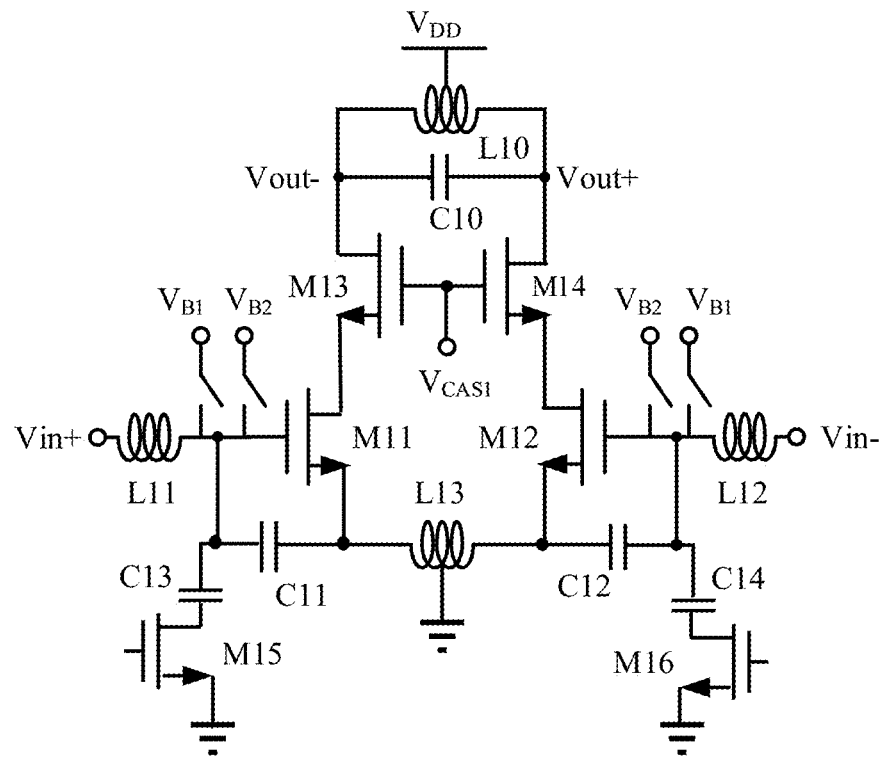
FIG. 10A and FIG. 10B are schematic structural diagrams of the first low-noise amplifiers of the two embodiments of the present application.

From FIG. 10A, the first low noise amplifier 10 in some embodiments includes a transistor M11, a transistor M12, a transistor M13, a transistor M14, a transistor M15, a transistor M16, an inductor L10, an inductor L11, an inductor L12, an inductor L13, Capacitor C10, capacitor C11, capacitor C12, capacitor C13 and capacitor C14. The second pole of the transistor M11 and the second pole of the transistor M12 are respectively connected to the first terminal and the second terminal of the inductor L13, and the third terminal of the inductor L13 is grounded; a capacitor C11 is connected between the control pole and the second pole of the transistor M11, the control pole of the transistor M11 is also used to connect the positive end of the input signal of the first low-noise amplifier through the inductor L11; the control pole of the transistor M11 is also connected with the first pole of the transistor M15 through the capacitor C13, and the second pole of the transistor M15 The pole is grounded; a capacitor C12 is connected between the control pole and the second pole of the transistor M12, and the control pole of the transistor M12 is also used to connect the negative terminal of the input signal of the first low-noise amplifier through the inductor L12; the control pole of the transistor M12 It is also connected to the first pole of the transistor M16 through the capacitor C14, and the second pole of the transistor M16 is grounded; the second pole of the transistor M13 is connected to the first pole of the transistor M11; the control of the transistor M13 is connected to the control pole of the transistor M14 connected and used to receive the voltage signal $V_{CAS1}$; the first pole of the transistor M13 is connected to one end of the capacitor C10, and the other end of the capacitor C10 is connected to the first pole of the transistor M14; the first pole of the transistor M13 is also connected to the first end of the inductor L10 connected, the second end of the inductor L10 is connected to the first pole of the transistor M14, the third end of the inductor L10 is used to receive the operating voltage $V_{DD}$; the second pole of the transistor M14 is connected to the first pole of the transistor M12; the transistor M11 The control electrode also receives the DC bias voltage signal $V_{B1}$ or the DC bias voltage signal $V_{B2}$ through the bias switching circuit; the control electrode of the transistor M12 also receives the DC bias through the bias switching circuit The voltage signal $V_{B1}$ or the DC bias voltage signal $V_{B2}$; wherein, the first switching signal includes the control voltage VEN in the first state and the control voltage Vblk in the second state, and when the first switching signal is received, the bias switching circuit disconnects the DC bias voltage signal VB1 from the gate electrode of the transistor M11 in response to the control voltage VEN in the first state, and disconnects the DC bias voltage signal VB1 in response to the control voltage Vblk in the second state. The DC bias voltage signal $V_{B2}$ is connected to the control electrode of the transistor M11; the second switching signal includes the control voltage VEN of the second state and the control voltage Vblk of the first state, when the second switching signal is received, the bias switching circuit connects the DC bias voltage signal VB1 to the control electrode of the transistor M11 in response to the control voltage VEN of the second state, and responds to the control voltage of the first state Vblk disconnects the DC bias voltage signal $V_{B2}$ from the control pole of the transistor M11; the control poles of the transistor M15 and the transistor M16 are also used to receive the control voltage VEN; the first pole of the transistor M13, The first pole of the transistor M14 serves as the negative terminal and the positive terminal of the output of the first low noise amplifier respectively. In some embodiments, the first state is low level, and the second state is high level.

Figure 10B:
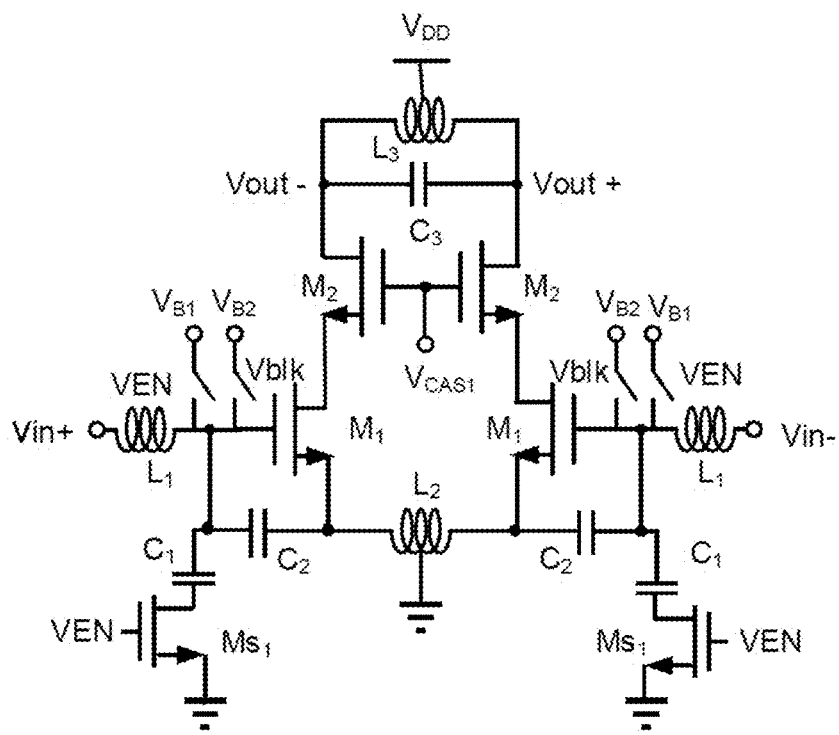

In some embodiments, the transistor M11 and the transistor M12 are transistors with the same parameter; the transistor M13 and the transistor M14 are transistors with the same parameter; the transistor M15 and the transistor M16 are transistors with the same parameter; the inductor L11 and the inductor L12 is an inductor with the same parameter; the capacitor C11 and capacitor C12 are capacitors with the same parameter; and the capacitor C13 and capacitor C14 are capacitors with the same parameter. For example, FIG. 10B is another example of the first low noise amplifier 10.

The fully differential structure in the first low noise amplifier 10 can ensure the minimum signal phase mismatch in the process of blocking cancellation. The noise amplifier of the first stage, that is, the first low noise amplifier 10, is composed of a dynamic input matching network with an inductively degenerated CS structure. The dynamic bias voltage VB2 is generated by the blocker strength sensed by the blocker signal extraction and bias generation circuit 30 at the output node of the first low noise amplifier 10.

The above is some descriptions of the first low noise amplifier 10, and the blocking signal extraction and bias generation circuit 30 will be described below.

Blocking signal extraction and bias generating circuit 30 is used to extract the blocking signal from the output signal of the first low noise amplifier 10, and output a DC voltage signal that is inversely related to the strength of the blocking signal, that is, the stronger the blocking signal is, Larger, the smaller the DC voltage signal, the smaller the intensity of the blocking signal, and the larger the DC voltage signal; the DC voltage signal is used as the above-mentioned DC bias voltage signal VB2, that is, as the bias of the first low noise amplifier 10 in blocking mode Signal.

Figure 11:
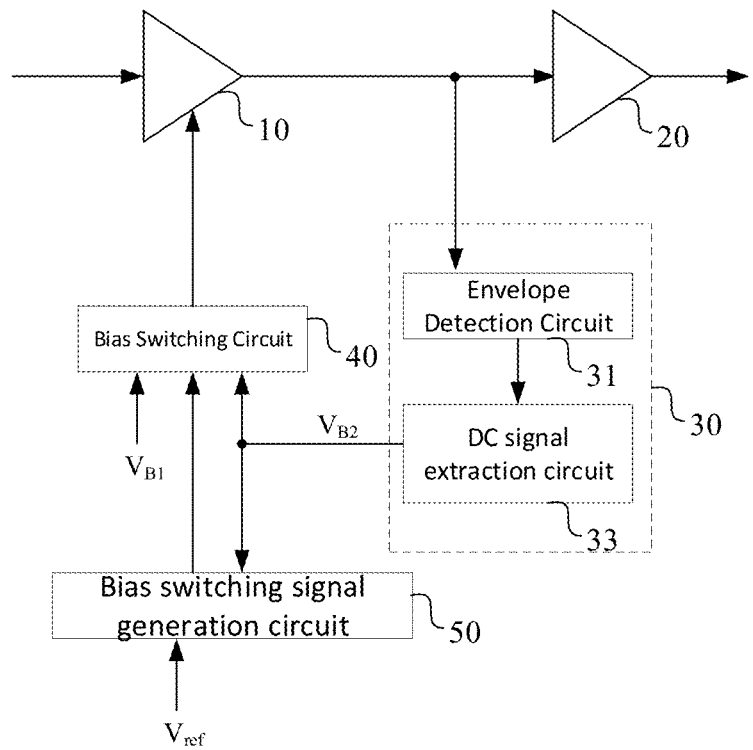
FIG. 11 is a schematic structural diagram of a blocking signal canceling low noise amplifier system according to an embodiment of the present application.

From FIG. 11, the blocking signal extraction and bias generation circuit 30 in some embodiments includes an envelope detection circuit 31 and a DC signal extraction circuit 33.

The envelope detection circuit 31 detects the envelope of the output signal of the first low-noise amplifier 10, and outputs a signal that is inversely related to the amplitude of the envelope. In other word, the larger amplitude of the detected envelope, the smaller output signal by the circuit 31, and the smaller the amplitude of the detected envelope, the larger output signal.

Figure 12A:
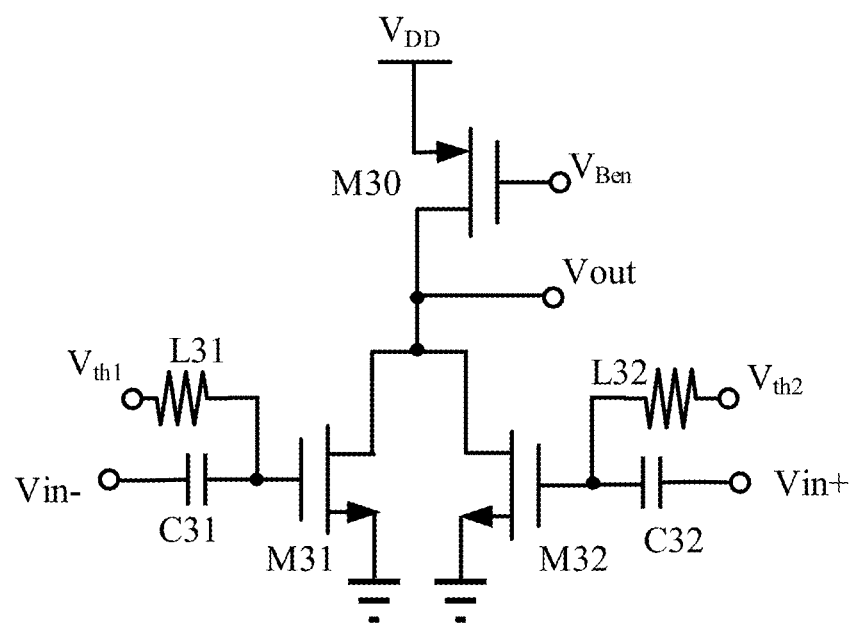
FIG. 12A and FIG. 12B are schematic structural diagrams of envelope detection circuits in two embodiments of the present application.

Please refer to FIG. 12A, in some embodiments, the envelope detection circuit 31 includes a transistor M30, a transistor M31, a transistor M32, an inductor L31, an inductor L32, a capacitor C31 and a capacitor C32. The first electrode of the transistor M31 is connected to the first electrode of the transistor M32, the second electrode of the transistor M31 is grounded, the control electrode of the transistor M31 also receives the bias voltage $V_{th1}$ through the inductor L31; the control electrode of the transistor M31 is connected to one end of the capacitor C31, The other end of the capacitor C31 is used as the negative end of the input of the envelope detection circuit; the second pole of the transistor M32 is grounded, and the control pole of the transistor M32 also receives the bias voltage $V_{th2}$ through the inductor L32; in some embodiments, the bias voltage The value of $V_{th1}$ is the value of the threshold voltage of the transistor M31; the value of the bias voltage $V_{th2}$ is the value of the threshold voltage of the transistor M32. The control pole of the transistor M32 is connected to one end of the capacitor C32, and the other end of the capacitor C32 is used as the positive terminal of the input of the envelope detection circuit; the first pole of the transistor M30 is connected to the first pole of the transistor M31, and the second pole of the transistor M30 For receiving the working voltage VDD, the control electrode of the transistor M30 is used for receiving the voltage $V_{Ben}$; the first electrode of the transistor M31 is also used as the output terminal of the envelope detection circuit.

In some embodiments, the transistor M31 and the transistor M32 are transistors with the same parameters; the inductor L31 and the inductor L32 are inductors with the same parameters; and the capacitor C31 and the capacitor C32 are capacitors with the same parameters. For example, FIG. 12B is another example of the envelope detection circuit 31.

The DC signal extraction circuit 33 is used to extract a DC voltage signal from the output signal of the envelope detection circuit 31 as the DC bias voltage signal $V_{B2}$. In some embodiments, the DC signal extraction circuit 33 includes a low-pass filter LPF.

Figure 12B:
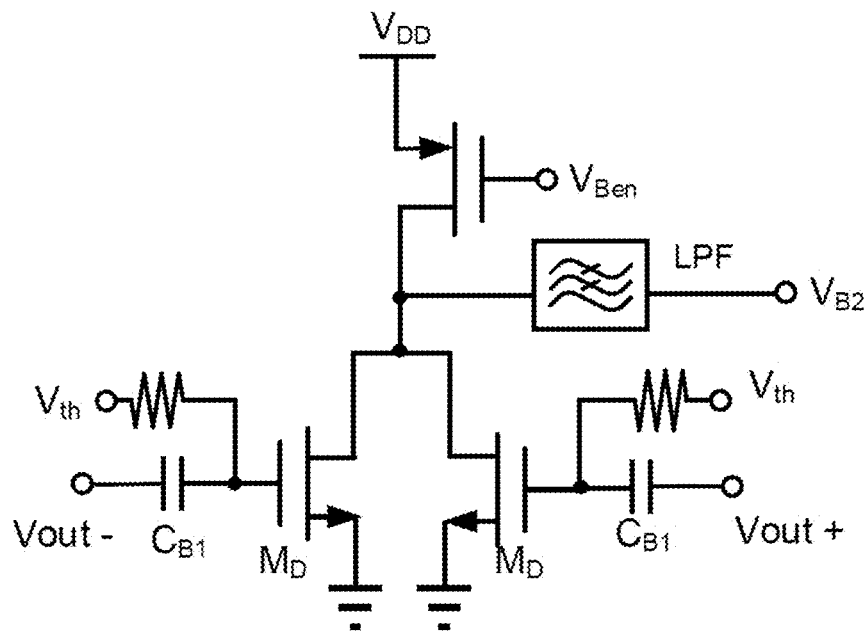
Figure 13:
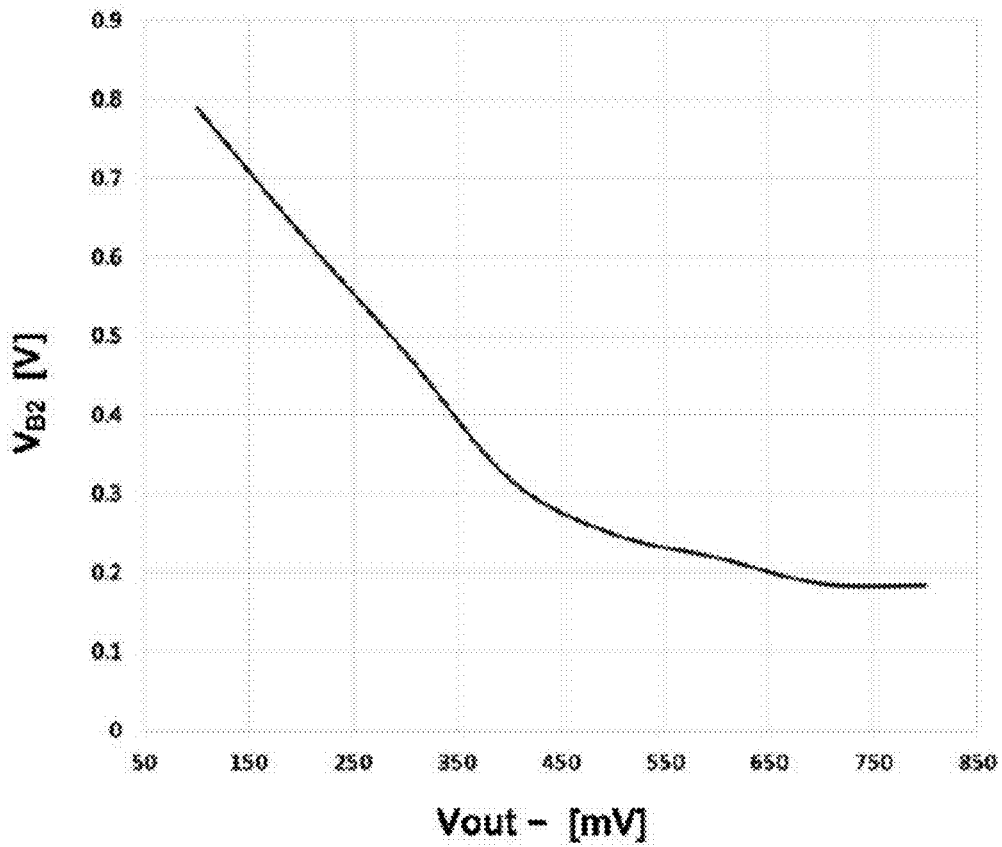
FIG. 13 is a characteristic curve diagram of a blocking signal extraction and bias generation circuit according to an embodiment of the present application.

FIG. 12A and FIG. 12B are differential envelope detection circuits. The signal at the output end of the first low-noise amplifier 10 (i.e. the output signal) will be coupled to the envelope detection circuit 31, and the voltage $V_{B2}$ is generated by the detection signals of different amplitudes (i.e. the output signal of the envelope detection circuit 31) through the low-pass filter LPF. Transistor MD is biased near its threshold voltage to maximize transconductance efficiency. As the amplitude of the blocking signal increases, voltage $V_{B2}$ decreases. The simulation relationship between the amplitude of the blocking signal Vout− or Vout+ and the voltage $V_{B2}$ is shown in FIG. 13. Changing the voltage $V_{Ben}$ can move the characteristic curve up and down to meet the best dynamic bias requirements.

The above is some descriptions of the blocking signal extraction and bias generation circuit 30, and the bias switching circuit 40 will be described below.

The bias switching circuit 40 is used to switch the first low noise amplifier 10 between blocking mode and small signal mode; the bias switching circuit 40 switches the bias signal of the first low noise amplifier 10 into a DC bias voltage signal $V_{B1}$, to switch the first low noise amplifier 10 to a small signal mode; the bias switching circuit 40 switches the bias signal of the first low noise amplifier 10 to a DC bias voltage signal $V_{B2}$ to switch the first low noise amplifier 10 switch to the blocking mode.

In some embodiments, the bias switching circuit 40 may include a switch circuit, such as the switch SVB1 and the switch SVB2 mentioned above, which can be controlled by the first switching signal and the second switching signal. For example, the first switching signal includes the control voltage VEN in the first state and the control voltage Vblk in the second state. When the first switching signal is received, the bias switching circuit disconnects the DC bias voltage signal VB1 from the gate electrode of the transistor M11 in response to the control voltage VEN of the first state, and disconnects the DC bias voltage signal $V_{B1}$ from the control electrode of the transistor M11 in response to the control voltage Vblk of the second state. The DC bias voltage signal $V_{B2}$ is connected to the control electrode of the transistor M11; The second switching signal includes a control voltage VEN in a second state and a control voltage Vblk in a first state, and when receiving the second switching signal, the bias switching circuit responds to the control voltage in the second state VEN connects the DC bias voltage signal $V_{B1}$ to the gate of the transistor M11, and transmits the DC bias voltage signal $V_{B2}$ from the gate of the transistor M11 in response to the control voltage Vblk of the first state disconnect.

The bias switching signal generating circuit 50 is used to compare the DC bias voltage signal $V_{B2}$ with a preset reference voltage signal $V_{ref}$. When the DC bias voltage signal VB2 is smaller than the reference voltage signal $V_{ref}$, the bias switching signal 50 generating circuit Generate the above-mentioned first switching signal, the first switching signal is used to make the bias switching circuit 40 switch or maintain the first low-noise amplifier 10 in the blocking mode; on the contrary, when the DC bias voltage signal $V_{B2}$ is greater than the reference voltage signal $V_{ref}$, Then the bias switching signal generating circuit 50 generates the above-mentioned second switching signal, and the second switching signal is used to make the bias switching circuit 40 switch or maintain the first low noise amplifier 10 in the small signal mode.

Figure 14:
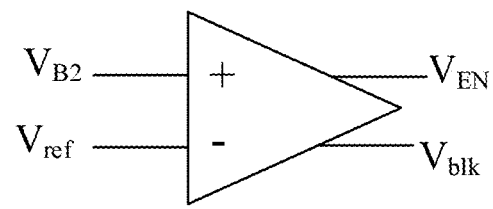
FIG. 14 is a schematic structural diagram of a comparator in an embodiment of the present application.

In some embodiments, the bias switching signal generating circuit 50 includes a comparator Comp. Please refer to FIG. 14, in some embodiments, the comparator Comp is used to compare the DC bias voltage signal $V_{B2}$ with a preset reference voltage signal $V_{ref}$, and when the DC bias voltage signal $V_{B2}$ is smaller than the reference voltage signal $V_{ref}$, The comparator Comp outputs a low-level control voltage VEN and a high-level control voltage Vblk as the first switching signal; when the DC bias voltage signal $V_{B2}$ is greater than the reference voltage signal $V_{ref}$, the comparator Comp outputs a high control voltage VEN and a low level control voltage Vblk serve as the second switching signal.

Figure 15:
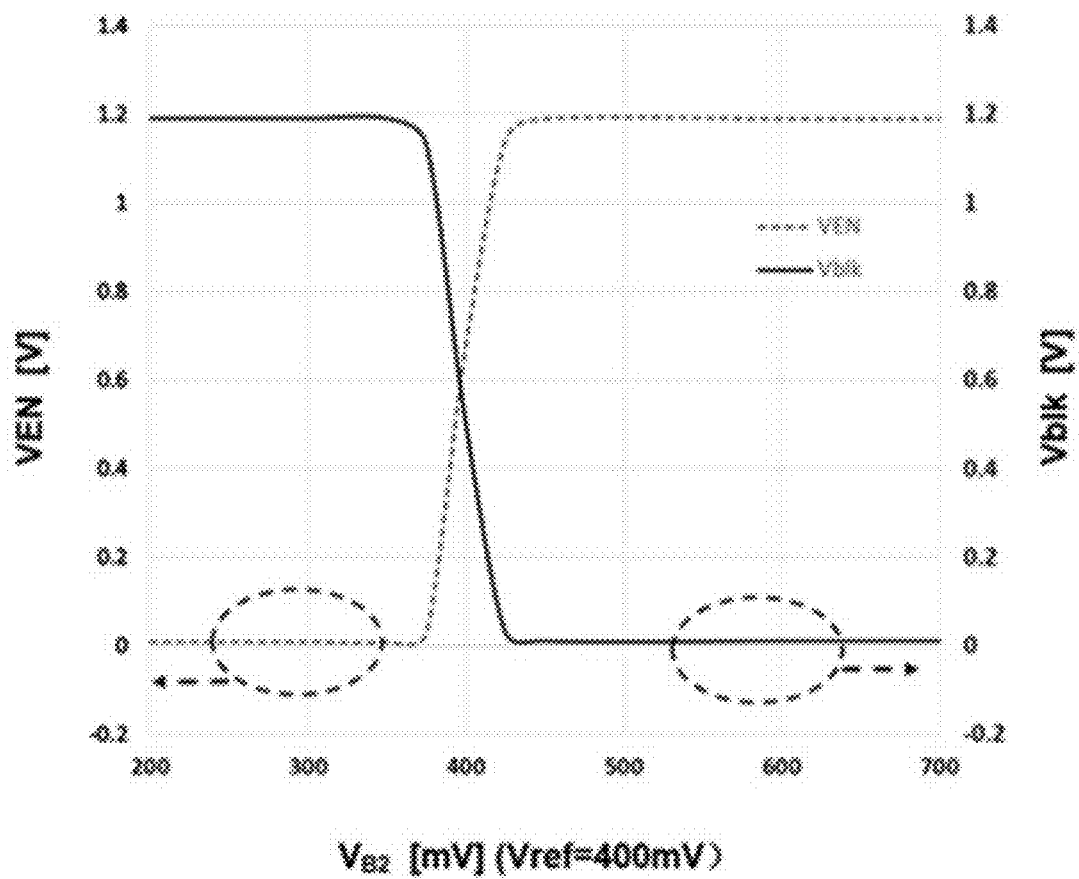
FIG. 15 is a transfer function diagram of the comparator involved in FIG. 14 of the present application.

By cooperating with the bias switching signal generation circuit 50 and the blockage signal extraction and bias generation circuit 30, it is possible to determine how strong the blockage should be for switching the working mode. The transfer function involved in the comparator Comp is shown in FIG. 15. When the reference voltage $V_{ref}$ of the comparator Comp is set to 0.4V, it can be seen from FIG. 15 that when the signal swing at Vout− (that is, the output port in FIG. 10B) is less than 350 mV, the first low-noise amplifier 10 will Work in small signal mode, otherwise, it will switch to blocking mode. The user can set the value of the reference voltage $V_{ref}$ referring to the 1 dB compression point of the first low noise amplifier 10 and FIG. 13. The second low-noise amplifier 20 is connected to the first low-noise amplifier 10, and is used to be biased by the class-A bias voltage $V_{BA}$ and the class-C bias voltage $V_{BC}$ at the same time, so as to eliminate the blocking of the output signal of the first low-noise amplifier 10 and zoom in.

Figure 16A:
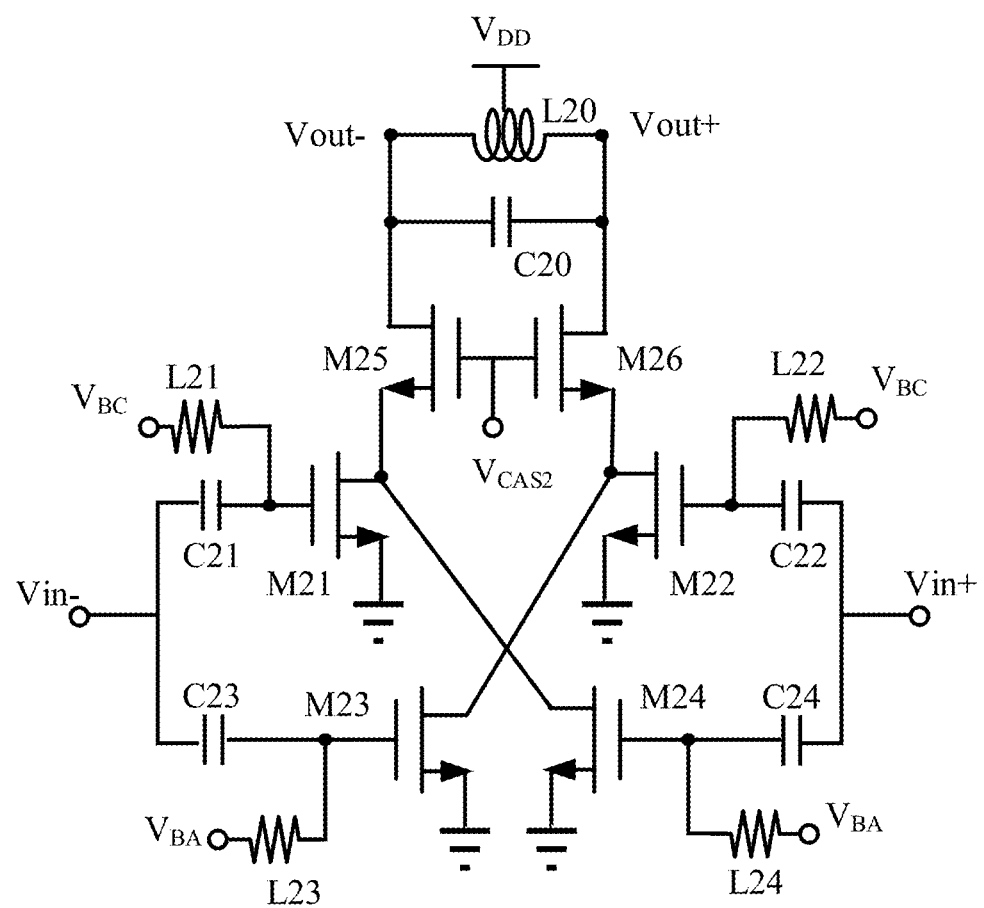
FIG. 16A and FIG. 16B are schematic structural diagrams of the second low noise amplifier of the two embodiments of the present application.

Please refer to FIG. 16A, in some embodiments, the second low noise amplifier 20 includes a transistor M21, a transistor M22, a transistor M23, a transistor M24, a transistor M25, a transistor M26, an inductor L20, an inductor L21, an inductor L22, an inductor L23, Inductor L24, capacitor C20, capacitor C21, capacitor C22, capacitor C23 and capacitor C24; the first pole of the transistor M21 is connected to the first pole of the transistor M24, the second pole of the transistor M21 is grounded, and the control pole of the transistor M21 is also passed through The inductor L21 receives the class C bias voltage VBC; the control electrode of the transistor M21 is also connected to one end of the capacitor C21, the other end of the capacitor C21 is connected to one end of the capacitor C23, and the other end of the capacitor C23 is connected to the control electrode of the transistor M23, The control pole of the transistor M23 also receives the class A bias voltage VBA through the inductor L23; the second pole of the transistor M23 is grounded; the end connected to the capacitor C21 and the capacitor C23 is also used as the negative end of the input of the second low noise amplifier The first pole of the transistor M22 is connected to the first pole of the transistor M23, the second pole of the transistor M22 is grounded, and the control pole of the transistor M22 also receives the class C bias voltage VBC through the inductor L22; the control pole of the transistor M22 Also connected to one end of the capacitor C22, the other end of the capacitor C22 is connected to one end of the capacitor C24, the other end of the capacitor C24 is connected to the control electrode of the transistor M24, and the control electrode of the transistor M24 also receives the class A bias voltage through the inductor L24 VBA; the second pole of the transistor M24 is grounded; the end that the capacitor C22 is connected to the capacitor C24 is also used as the positive terminal of the second low-noise amplifier input; the second pole of the transistor M25 is connected to the first pole of the transistor M21 The control of the transistor M25 is connected to the control pole of the transistor M26, and is used to receive the voltage signal VCAS2; the first pole of the transistor M25 is connected to one end of the capacitor C20, and the other end of the capacitor C20 is connected to the first pole of the transistor M26; The first pole of M25 is also connected to the first end of the inductance L20, the second end of the inductance L20 is connected to the first pole of the transistor M26, and the third end of the inductance L20 is used to receive the operating voltage VDD; the second pole of the transistor M26 is connected to the first pole of the transistor M26. The first pole of the transistor M22 is connected; the first pole of the transistor M25 and the first pole of the transistor M26 serve as the negative terminal and the positive terminal of the output of the second low noise amplifier respectively.

Figure 16B:
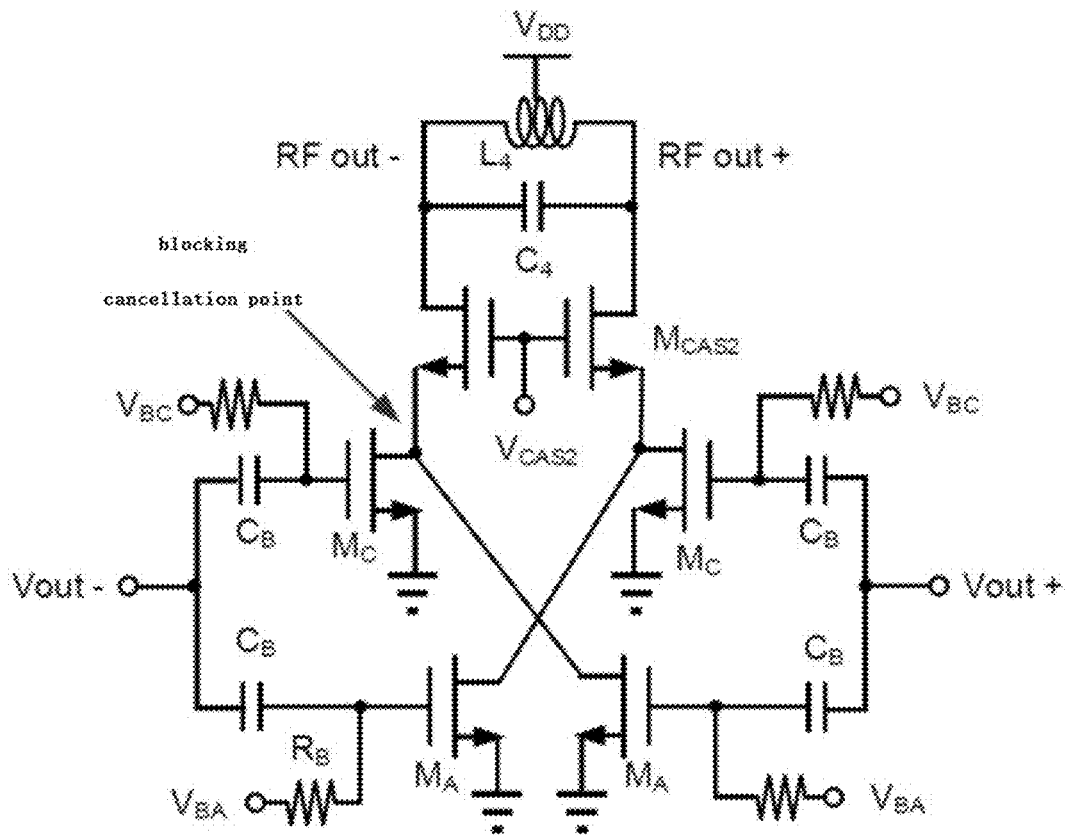

In some embodiments, the transistor M21 and the transistor M22 are transistors with the same parameter; the transistor M23 and the transistor M24 are transistors with the same parameter; the transistor M25 and the transistor M26 are transistors with the same parameter; the inductor L21 and the inductor L22 is an inductor with the same parameter; the inductor L23 and the inductor L24 are inductors with the same parameter; the capacitor C21 and capacitor C22 are capacitors with the same parameter; and the capacitor C23 and capacitor C24 are capacitors with the same parameter. For example, FIG. 16B is another example of the second low noise amplifier 20.

The fully differential structure of the second low noise amplifier 20 can ensure the minimum signal phase mismatch in the process of blocking cancellation. The second low noise amplifier 20 is a cancellation stage. A large $W_C$ can ensure that a lower $V_{BC}$ is applied to ensure a good class-C bias, and can also provide a larger small-signal gain in blocking mode. However, the value of WC needs to be traded off with the parasitic capacitance introduced to affect the operating frequency. Therefore, in some embodiments, WC is set to 192 um, and the range of $V_{BC}$ is set to 0-100 mV. The tuning range of the class A bias voltage $V_{BA}$ should be as large as possible to match the blocking current of the transistor $M_C$, so $W_A$ should be smaller than $W_C$, which can be 16 um in some embodiments. At the same time, it should be avoided that the transistor $M_A$ is in the C-class working state in the blocking mode to deteriorate the noise of the low-noise amplifier or be in the linear region, that is, the bias voltage $V_{BA}$ of the transistor $M_A$ should be between its threshold voltage and the voltage $M_{CAS2}$.

Figure 17:
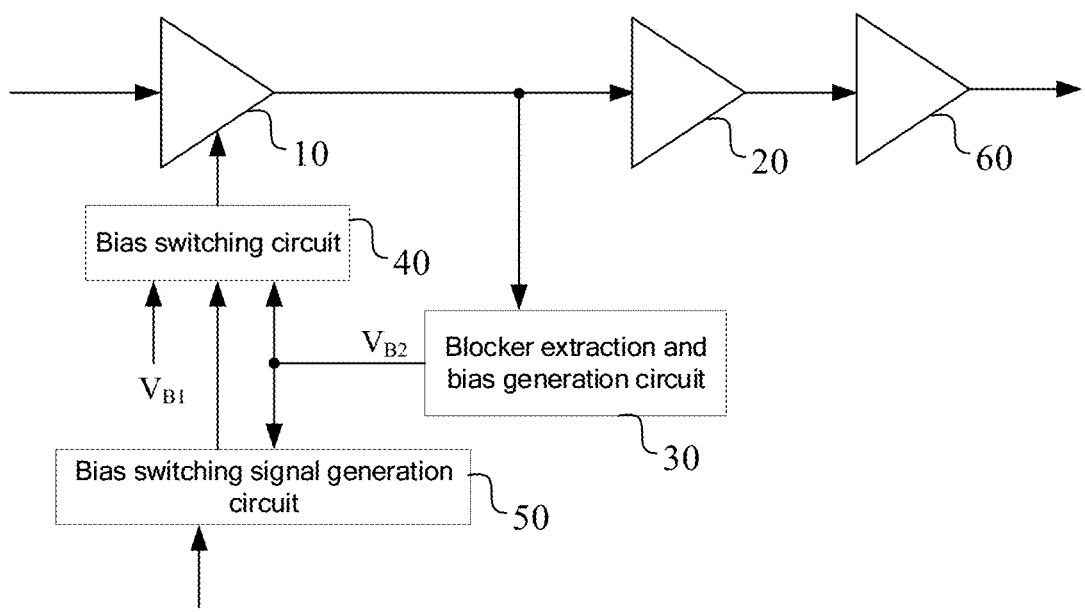
FIG. 17 is a schematic structural diagram of a blocking signal canceling low noise amplifier system according to an embodiment of the present application.

From the FIG. 17, the blocking signal canceling low noise amplifier system in some embodiments also includes a buffer 60, the buffer 60 is used to receive the output signal of the second low noise amplifier 20, and the output of the buffer 60 is used as the blocking signal canceling low output of the noise amplifier system.

The above is the description of the blocking signal cancellation low noise amplifier system in some embodiments of the present application.

In some embodiments, the blocking signal cancellation low noise amplifier system of the present application can be manufactured by a 65 nm CMOS process, and the chip area (including the output driver) is 0.88×0.59 mm². In small signal mode, the quiescent current consumption is 17-20 mA at 1.2V supply voltage, and 23/25 mA current consumption at −15/−10 dbm blocking. The effects of blocking cancellation and phase mismatch are first simulated and explained.

Figure 18A:
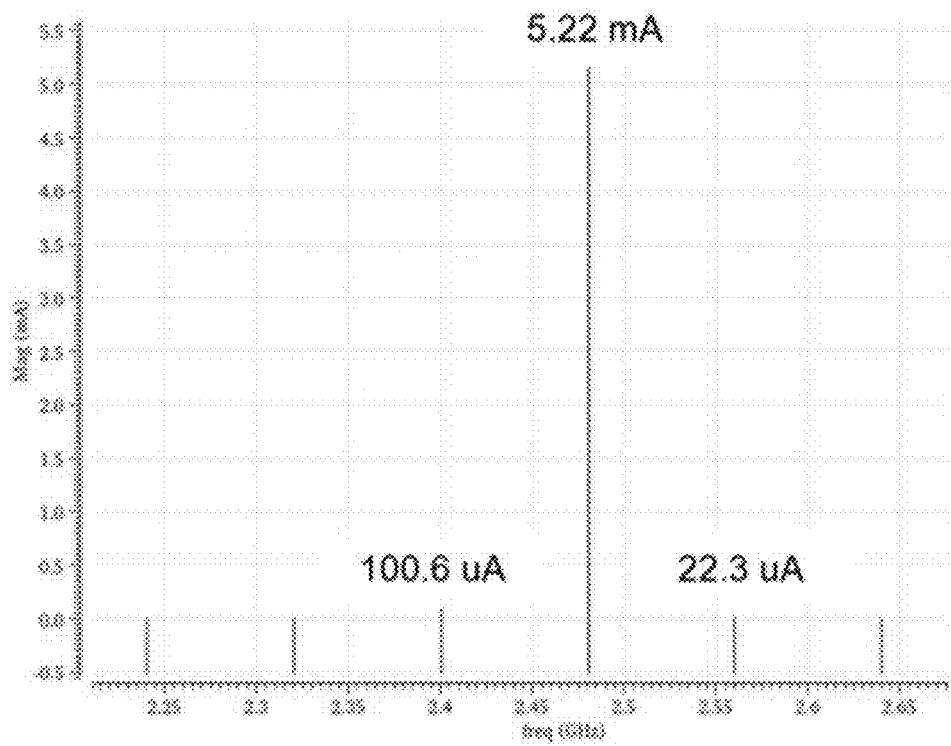
FIG. 18A, FIG. 18B and FIG. 18C show the current spectrum of the blocking cancellation point of transistor MA, transistor MC and transistor MCAS2 in FIG. 16B.
Figure 18B:
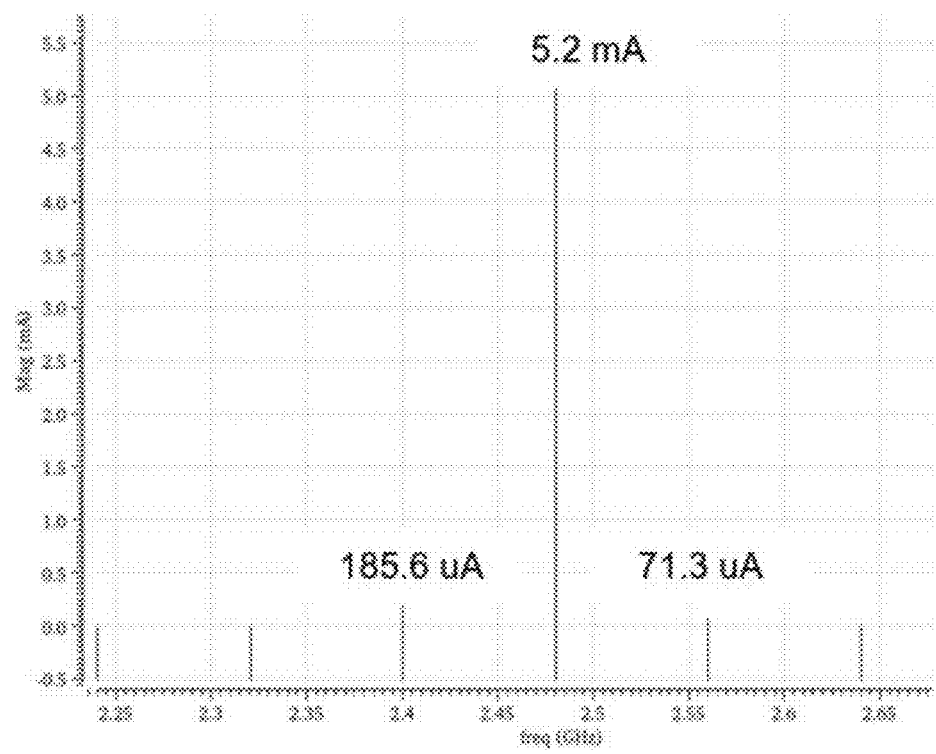
Figure 18C:
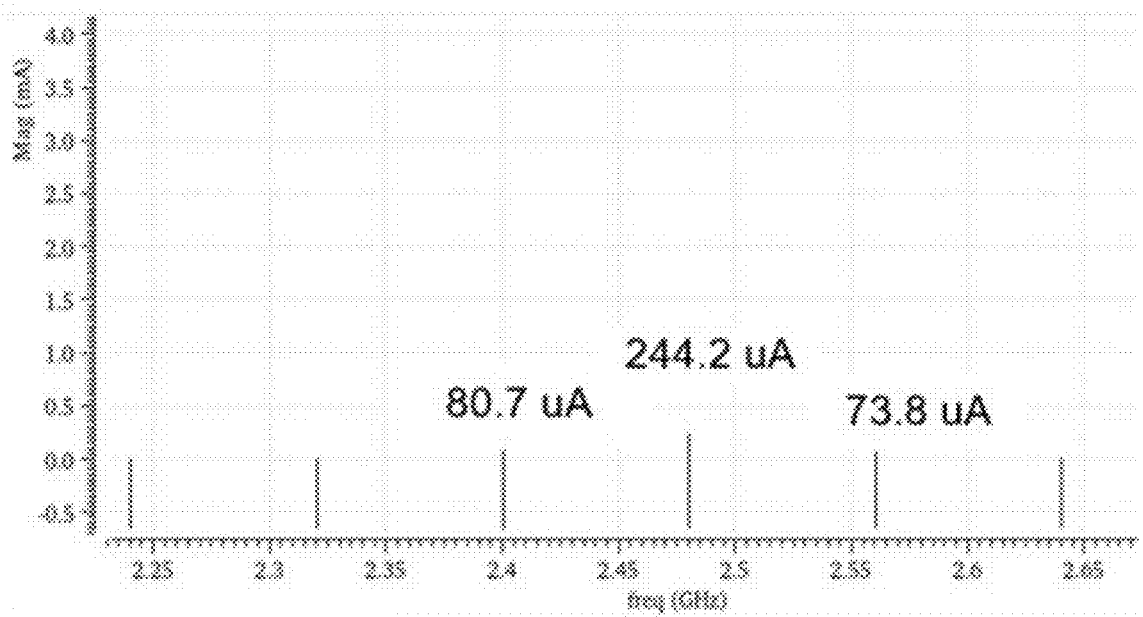

FIG. 18A, FIG. 18B and FIG. 18C show the current spectrum of the blocking cancellation point of transistor $M_A$, transistor $M_C$ and transistor $M_{CAS2}$ in FIG. 16B, the abscissa is frequency, unit is GHz, the ordinate is current, and the unit is mA. When a 2.48 GHz, −15 dBm blocking and 2.4 GHz, −50 dBm desired small signal mixed input system, transistor $M_A$, transistor $M_C$ and transistor $M_{CAS2}$ all contain 2.4 GHz, 2.48 GHz components and intermodulation products. In FIG. 18A and FIG. 18B, the offset effect is maximized by adjusting the voltages $V_{BA}$ and $V_{BC}$ to make the absolute values of the blocking current spectrum values of transistor $M_A$ and transistor $M_C$ equal, which are 5.22 mA and 5.2 mA, respectively. After cancellation, the blocking current in transistor $M_{CAS2}$ is reduced to 244.2 µA. The remaining small signal current becomes 80.7 µA.

Although there will be intermodulation products at 2.56 GHz in the process of canceling the blocking, its distance from the ideal signal frequency band is twice that of the blocking. And the narrow-band characteristic of the LNA will further suppress the amplification of the intermodulation. If the receiver uses a high-performance local oscillator for down-conversion processing, the intermodulation products will not cause significant mutual mixing problems.

Figure 19:
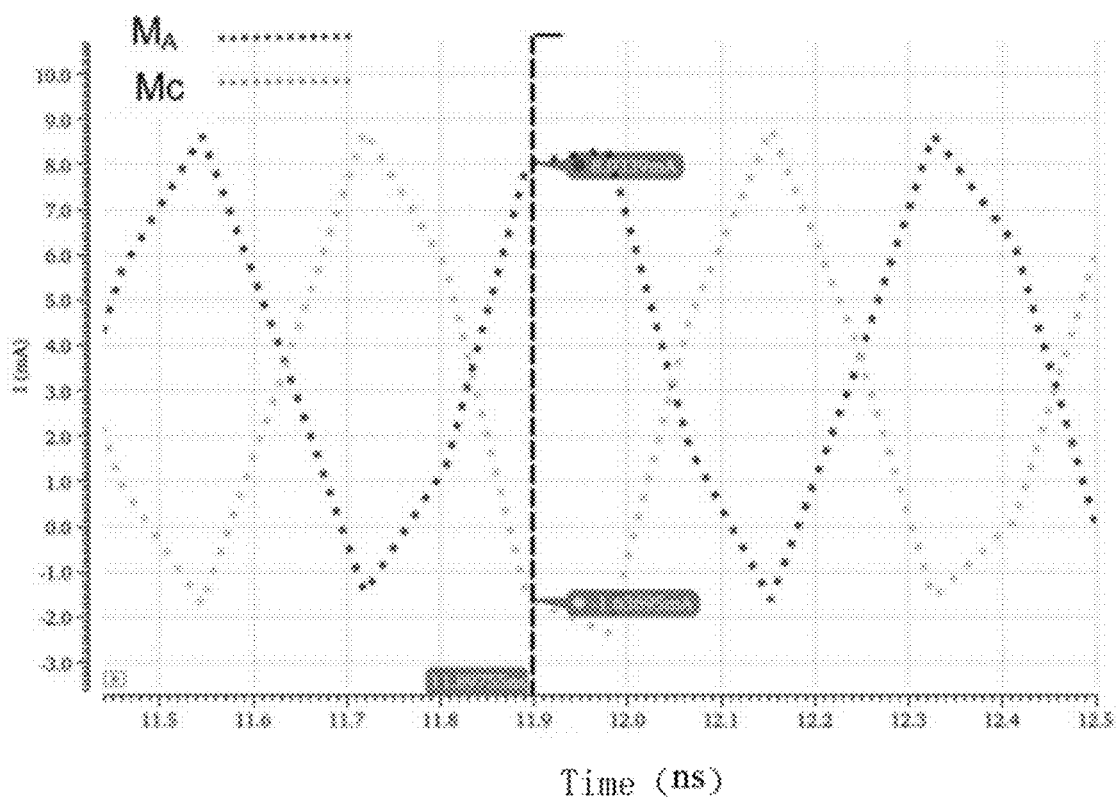
FIG. 19 is a schematic diagram of transient simulation results of blocking current in transistor MA and transistor MC according to an embodiment of the present application.

FIG. 19 is a transient simulation result of blocking current in transistor $M_A$ and transistor $M_C$. The current phase alignment in transistor $M_A$ and transistor $M_C$ is better, indicating that the maximum phase matching is achieved; however, additional unavoidable phase mismatch problems will be introduced by the layout design and manufacturing process, but the impact of this error is usually very small.

Then simulate and explain the S parameters and noise figure NF.

Figure 20:
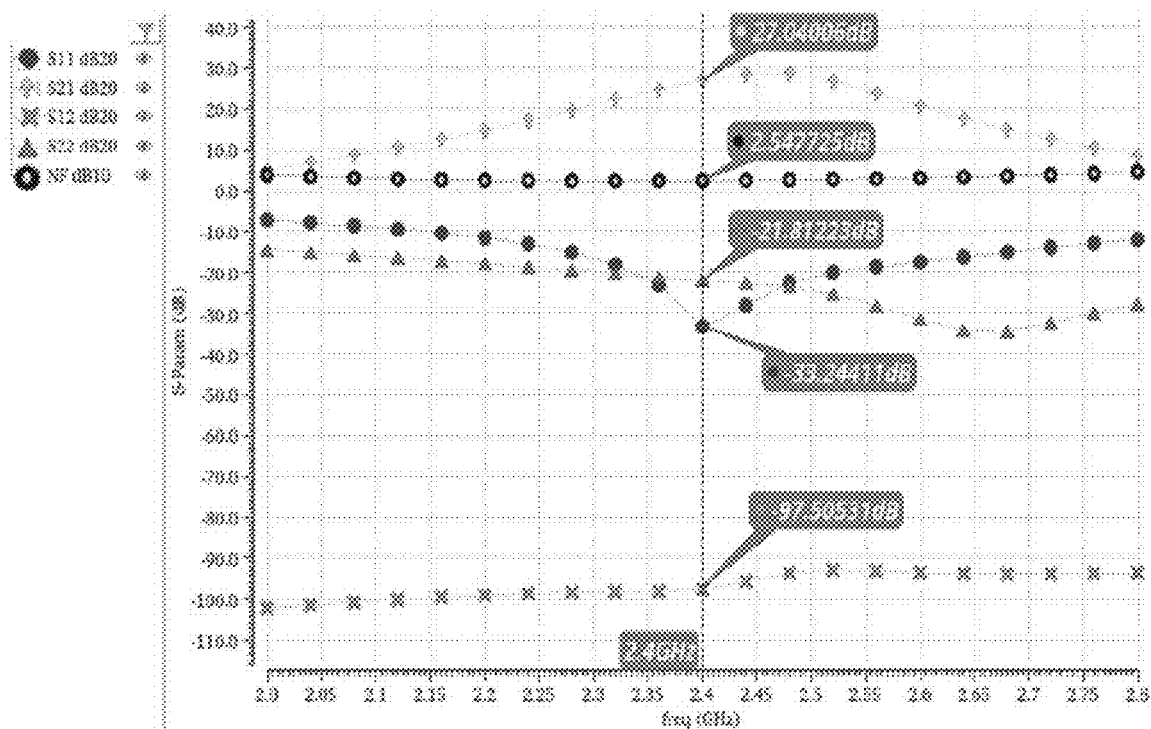
FIG. 20 is a schematic diagram of post-simulation S parameters and NF in small signal mode according to an embodiment of the present application.

The post-simulation S-parameters for the small-signal case are shown in FIG. 20. Under the operating frequency of 2.4 GHz, the system gain is 27 dB, the −3 dB bandwidth is 160 MHz, and the NF is 2.55 dB. S11 and S22 are less than −10 dB in the range of 2.2-2.8 GHz, which indicates that the input and output are well matched. Reverse isolation S12 is lower than −90 dB. By tuning the $V_{BA}$ (0.4V-0.7V), the gain range is 27-33 dB.

Figure 21:
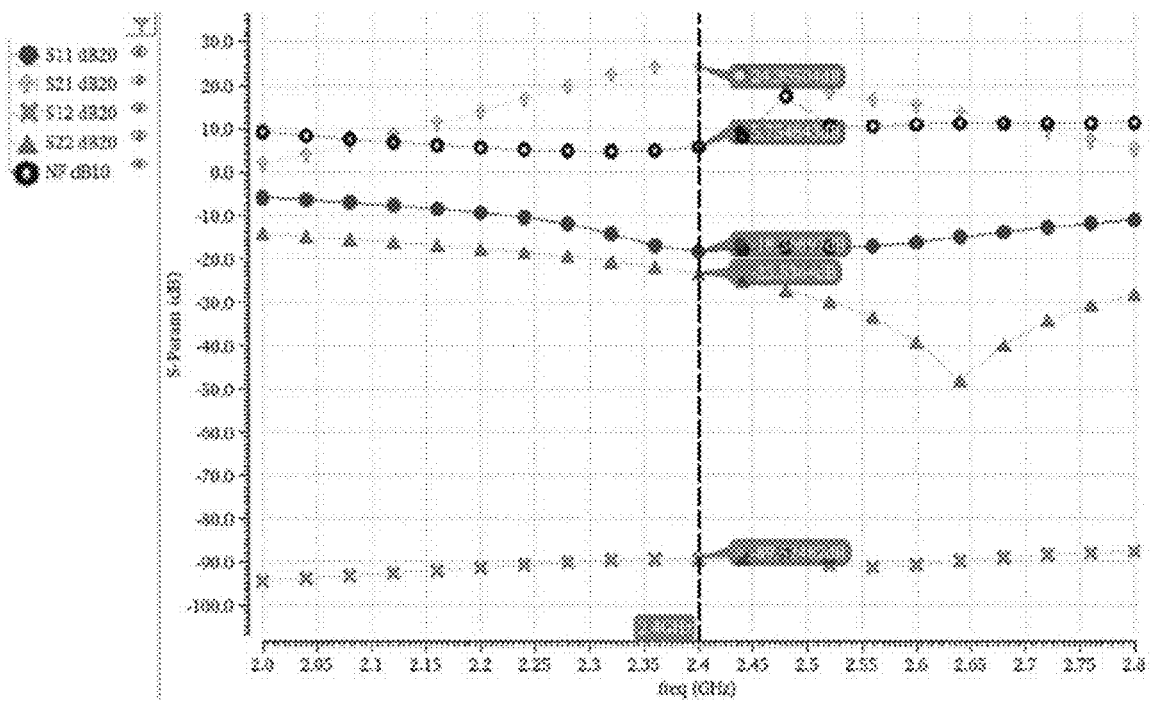
FIG. 21 is the post-simulation S parameter and NF under −15 dBm, 2.48 GHz blocking injection of an embodiment of the present application.

When a single tone 2.48 GHz, −15 dBm blocking signal is injected and the system is adjusted to cancel, the gain at 2.4 GHz is 24.4 dB as shown in FIG. 21. The gain peak shifts slightly towards lower frequencies due to the introduction of the parasitic capacitance of transistor MC. With the help of dynamic input matching and biasing strategies, S11 and S22 remain below −10 dB in the 2.2-2.8 GHz range. NF rises from 2.54 dB in small signal mode to 5.75 dB. FIG. 22 also shows the performance at −10 dBm blocking. At 2.4 GHz, the gain is 19.4 dB and the NF is 6.72 dB. When there is no blocking, the 1 dB compression point P1 dB of 2.4 GHz is −33.2 dBm. Under −15 dbm and −10 dbm blocking, the simulation P1 dB at 2.4 GHz is −18 dBm and −15 dBm respectively. P1 dB is mitigated because the test output drive will limit the P1 dB, but the output of the LNA is often connected to the next stage mixer.

The table in FIG. 23 summarizes and compares the performance of this application and other blocking filter RF front-end structures, among which the reference 8 refers to the receiver. At 2.4 GHz, the power consumption in the small signal mode of this application is within 24 mW, and the NF is 2.54 dB. Compared with the solution in reference 7, in the two modes, the NF, power consumption and core area of the present application are significantly reduced, and the problem of mutual frequency mixing is also solved. Compared with the solution in reference 1, the NF of the small-signal mode of this application has decreased.

Some embodiments of the present application propose a new low noise amplifier structure that directly cancels blocking signals in the time domain in crowded frequency bands. Using dynamic input matching and bias technology, in small signal mode, the NF of this LNA at 2.4 GHz is 2.54 dB, and the gain can reach 27-33 dB. At 80 MHz, −15/10 dBm blocking, NF and gain are 5.75/6.72 dB and 24.4/19.4 dB gain respectively, power consumption is 27.6/30 mW. Some embodiments of the present application do not use local oscillators, mixers, and filters in blocking processing, so as to achieve minimum phase mismatch when canceling blocking, and do not introduce mutual frequency mixing problems. However, under the structure of the inductance degenerated input matching network, excessive blocking power will easily saturate the transistor, and the nonlinear effect will be enhanced, thereby deteriorating the effect of input matching and the ability to eliminate blocking.

This document is described with reference to various exemplary embodiments. However, those skilled in the art will recognize that changes and modifications can be made to the exemplary embodiments without departing from the scope herein. For example, the various operational steps, as well as the components used to perform the operational steps, may be implemented in different ways depending on the particular application or considering any number of cost functions associated with the operation of the system (e.g., one or more steps may be deleted, modified or incorporated into other steps).

While the principles herein have been shown in various embodiments, many modifications in structure, arrangement, proportions, elements, materials and components, particularly suited to particular circumstances and operational requirements may be made without departing from the principles and scope of this disclosure use. The above modifications and other changes or amendments are intended to be included within the scope of this document.

The foregoing detailed description has been described with reference to various embodiments. However, those skilled in the art will recognize that various modifications and changes can be made without departing from the scope of the present disclosure. Accordingly, the disclosure is to be considered in an illustrative rather than a restrictive sense, and all such modifications are intended to be embraced within its scope. Also, advantages, other advantages and solutions to problems have been described above with respect to various embodiments. However, neither benefits, advantages, solutions to problems, nor any elements that lead to these, or make the solutions more definite, should be construed as critical, required, or necessary. As used herein, the term "comprises" and any other variants thereof are non-exclusive, such that a process, method, article, or apparatus that includes a list of elements includes not only those elements, but also elements not expressly listed or not part of the process, like method, system, article or other element of a device. Additionally, the term "coupled" and any other variations thereof, as used herein, refers to a physical connection, an electrical connection, a magnetic connection, an optical connection, a communicative connection, a functional connection, and/or any other connection.

Those skilled in the art will recognize that many changes may be made to the details of the above-described embodiments without departing from the underlying principles of the invention. Accordingly, the scope of the invention should be determined only by the claims.

What is claimed is:

1. A blocking signal cancellation low noise amplifier system, comprising a first low noise amplifier, a second low noise amplifier, a blocking signal extraction and bias generation circuit, a bias switching circuit, and a bias switching signal generating circuit; wherein the first low noise amplifier is used for dynamic input matching, and the first low noise amplifier receives an input signal and outputs it after amplifying; the first low noise amplifier has a blocking mode and a small signal mode, and in the small signal mode, a bias signal of the first low noise amplifier is a DC bias voltage signal $V_{B1}$, and in the blocking mode, the bias signal of the first low noise amplifier is a DC bias voltage signal $V_{B2}$;

the blocking signal extraction and bias generation circuit is used to extract a blocking signal from an output signal of the first low noise amplifier, and output a DC voltage signal having an inverse relationship with a strength of the blocking signal as the DC Bias voltage signal $V_{B2}$;

the bias switching circuit is used to switch the first low noise amplifier between the blocking mode and the small signal mode; the bias switching circuit switches the bias signal of the first low noise amplifier to the DC bias voltage signal $V_{B1}$ to switch the first low noise amplifier into the small signal mode; the bias switching circuit switches the bias signal of the first low noise amplifier to the DC bias voltage signal $V_{B2}$ to switch the first low noise amplifier into the blocking mode;

the bias switching signal generating circuit is used to compare the DC bias voltage signal $V_{B2}$ with a preset reference voltage signal $V_{ref}$, and when the DC bias voltage signal $V_{B2}$ is smaller than the preset reference voltage signal $V_{ref}$, the bias switching signal generating circuit generates a first switching signal, and the first switching signal is used to make the bias switching circuit switch or maintain the first low noise amplifier in the blocking mode; otherwise, when the DC bias voltage signal $V_{B2}$ is greater than the preset reference voltage signal $V_{ref}$, the bias switching signal generating circuit generates a second switching signal, and the second switching signal is used to make the bias switching circuit switch or maintain the first low noise amplifier in the small signal mode; and the second low noise amplifier is connected to the first low noise amplifier, and is used to be biased by a class-A bias voltage $V_{BA}$ and a class-C bias voltage $V_{BC}$ at the same time, so as to control the output signal of the first low noise amplifier to perform block removal and amplification.

2. The blocking signal cancellation low noise amplifier system as claimed in claim 1, wherein the first low noise amplifier comprises a transistor M11, a transistor M12, a transistor M13, a transistor M14, a transistor M15, a transistor M16, an inductor L10, an inductor L11, an inductor L12, an inductor L13, a capacitor C10, a capacitor C11, a capacitor C12, a capacitor C13 and a capacitor C14;

a second pole of the transistor M11 and a second pole of the transistor M12 are respectively connected to a first terminal and a second terminal of the inductor L13, and a third terminal of the inductor L13 is grounded; a control pole and the second pole of the transistor M11 are connected with the capacitor C11, the control pole of the transistor M11 is also used to connect a positive terminal of the input signal of the first low noise amplifier through the inductor L11; the control pole of the transistor M11 is also connected with a first pole of the transistor M15 through the capacitor C13, and a second pole of the transistor M15 is grounded; the capacitor C12 is connected between a control pole and the second pole of the transistor M12, and the control pole of the transistor M12 is also used to connect a negative terminal of the input signal of the first low noise amplifier through the inductor L12; the control pole of the transistor M12 is also connected to a first pole of the transistor M16 through the capacitor C14, and a second pole of the transistor M16 is grounded;

a second pole of the transistor M13 is connected to a first pole of the transistor M11; a control of the transistor M13 is connected to a control pole of the transistor M14, and is used to receive a voltage signal $V_{CAS1}$; a first pole of the transistor M13 is connected to one end of the capacitor C10, and the other end of the capacitor C10 is connected to a first pole of the transistor M14; the first pole of the transistor M13 is also connected to a first end of the inductor L10, a second end of the inductor L10 is connected to the first pole of the transistor M14, and a third end of the inductor L10 is used to receive a working voltage $V_{DD}$; a second pole of the transistor M14 is connected to a first pole of the transistor M12;

the control pole of the transistor M11 also receives the DC bias voltage signal $V_{B1}$ or the DC bias voltage signal $V_{B2}$ through the bias switching circuit; the control pole of the transistor M12 also receives the DC bias voltage signal $V_{B1}$ or the DC bias voltage signal $V_{B2}$ through the bias switching circuit; wherein, the first switching signal comprises a control voltage $V_{EN}$ of a first state and a control voltage $V_{blk}$ of a second state; when the first switching signal is received, the bias switching circuit responds to the control voltage $V_{EN}$ of the first state to disconnect the DC bias voltage signal $V_{B1}$ from the control pole of the transistor M11, and responds to the control voltage $V_{blk}$ of the second state to connect the DC bias voltage signal $V_{B2}$ to the control pole of the transistor M11; the second switching signal comprises a control voltage $V_{EN}$ in the second state and a control voltage $V_{blk}$ in the first state; when the second switching signal is used, the bias switching circuit connects the DC bias voltage signal $V_{B1}$ to the control pole of the transistor M11 in response to the control voltage $V_{EN}$ in the second state, and responds to the control voltage $V_{blk}$ in the first state to disconnect the DC bias voltage signal $V_{B2}$ from the control pole of the transistor M11; control poles of the transistor M15 and the transistor M16 are also used to receive the control voltage $V_{EN}$; and the first pole of the transistor M13 and the first pole of the transistor M14 serve as a negative terminal and a positive terminal of an output of the first low noise amplifier respectively.

3. The blocking signal cancellation low noise amplifier system as claimed in claim 2, wherein the transistor M11 and the transistor M12 are transistors with same parameter; the transistor M13 and the transistor M14 are transistors with same parameter; the transistor M15 and the transistor M16 are transistors with same parameter; the inductor L11 and the inductor L12 are inductors with same parameter; the capacitor C11 and the capacitor C12 are capacitors with same parameter; and the capacitor C13 and the capacitor C14 are capacitors with same parameter.

4. The blocking signal cancellation low noise amplifier system as claimed in claim 2, wherein the first state is low level, and the second state is high level.

5. The blocking signal cancellation low noise amplifier system as claimed in claim 1, wherein the second low noise amplifier comprises a transistor M21, a transistor M22, a transistor M23, a transistor M24, a transistor M25, a transistor M26, an inductor L20, an inductor L21, an inductor L22, an inductor L23, an inductor L24, a capacitor C20, a capacitor C21, a capacitor C22, a capacitor C23 and a capacitor C24;

a first pole of the transistor M21 is connected to a first pole of the transistor M24, a second pole of the transistor M21 is grounded, and a control pole of the transistor M21 also receives the class-C bias voltage $V_{BC}$ through the inductor L21; the control pole of the transistor M21 is also connected to one end of the capacitor C21, the other end of the capacitor C21 is connected to one end of the capacitor C23, the other end of the capacitor C23 is connected to a control pole of the transistor M23, and the control pole of the transistor M23 also receives the class-A bias voltage $V_{BA}$ through the inductor L23; a second pole of the transistor M23 is grounded; the end where the capacitor C21 is connected to the capacitor C23 is also used as a negative terminal of an input of the second low noise amplifier;

a first pole of the transistor M22 is connected to a first pole of the transistor M23, a second pole of the transistor M22 is grounded, and a control pole of the transistor M22 also receives the class-C bias voltage $V_{BC}$ through the inductor L22; the control pole of the transistor M22 is also connected to one end of the capacitor C22, the other end of the capacitor C22 is connected to one end of the capacitor C24, the other end of the capacitor C24 is connected to a control pole of the transistor M24, and the control pole of the transistor M24 also receives the class-A bias voltage $V_{BA}$ through the inductor L24; a second pole of the transistor M24 is grounded; the end where the capacitor C22 is connected to the capacitor C24 is also used as a positive terminal of the input of the second low noise amplifier;

a second pole of the transistor M25 is connected to the first pole of the transistor M21; a control of the transistor M25 is connected to a control pole of the transistor M26, and is used to receive a voltage signal $V_{CAS2}$; a first pole of the transistor M25 is connected to one end of the capacitor C20, the other end of the capacitor C20 is connected to a first pole of the transistor M26; the first pole of the transistor M25 is also connected to a first end of the inductor L20, a second end of the inductor L20 is connected to the first pole of the transistor M26, and a third end of the inductor L20 is used to receive a working voltage $V_{DD}$; a second pole of the transistor M26 is connected to the first pole of the transistor M22; and the first pole of the transistor M25 and the first pole of the transistor M26 serve as a negative terminal and a positive terminal of an output of the second low noise amplifier respectively.

6. The blocking signal cancellation low noise amplifier system as claimed in claim 5, wherein the transistor M21 and the transistor M22 are transistors with same parameter; the transistor M23 and the transistor M24 are transistors with same parameter; the transistor M25 and the transistor M26 are transistors with same parameters; the inductor L21 and the inductor L22 are inductors with same parameters; the inductor L23 and the inductor L24 are inductors with same parameters; the capacitor C21 and the capacitor C22 are capacitors with same parameters; and the capacitor C23 and the capacitor C24 are capacitors with same parameters.

7. The blocking signal cancellation low noise amplifier system as claimed in claim 1, wherein the blocking signal extraction and bias generation circuit comprises an envelope detection circuit and a DC signal extraction circuit;

the envelope detection circuit detects an envelope of the output signal of the first low noise amplifier, and outputs a signal that is inversely related to a magnitude of the envelope; and the DC signal extraction circuit is used to extract a DC voltage signal from an output signal of the envelope detection circuit as the DC bias voltage signal $V_{B2}$.

8. The blocking signal cancellation low noise amplifier system as claimed in claim 7, wherein the envelope detection circuit comprises a transistor M30, a transistor M31, a transistor M32, an inductor L31, an inductor L32, a capacitor C31 and a capacitor C32;

a first pole of the transistor M31 is connected to a first pole of the transistor M32, a second pole of the transistor M31 is grounded, and a control pole of the transistor M31 also receives a bias voltage $V_{th1}$ through the inductor L31; the control pole of the transistor M31 is connected to one end of the capacitor C31, and the other end of the capacitor C31 is used as a negative terminal of an input of the envelope detection circuit;

a second pole of the transistor M32 is grounded, and a control pole of the transistor M32 also receives a bias voltage $V_{th2}$ through the inductor L32; the control pole of the transistor M32 is connected to one end of the capacitor C32, and the other end of the capacitor C32 is used as a positive terminal of the input of the envelope detection circuit; and a first pole of the transistor M30 is connected to the first pole of the transistor M31, a second pole of the transistor M30 is used to receive a working voltage $V_{DD}$, and a control pole of the transistor M30 is used to receive a voltage $V_{Ben}$; the first pole of the transistor M31 also serves as an output terminal of the envelope detection circuit.

9. The blocking signal cancellation low noise amplifier system as claimed in claim 8, wherein the transistor M31 and the transistor M32 are transistors with same parameter; the inductor L31 and the inductor L32 are inductors with same parameter; and the capacitor C31 and the capacitor C32 are capacitors with same parameters.

10. The blocking signal cancellation low noise amplifier system as claimed in claim 8, wherein a value of the bias voltage $V_{th1}$ is a value of a threshold voltage of the transistor M31; and a value of the bias voltage $V_{th2}$ is a value of a threshold voltage of the transistor M32.

11. The blocking signal cancellation low noise amplifier system as claimed in claim 7, wherein the DC signal extraction circuit comprises a low-pass filter.

12. The blocking signal cancellation low noise amplifier system as claimed in claim 1, wherein the bias switching signal generating circuit comprises a comparator.

13. The blocking signal cancellation low noise amplifier system as claimed in claim 12, wherein the comparator is used to compare the DC bias voltage signal $V_{B2}$ with the preset reference voltage signal $V_{ref}$, wherein when the DC bias voltage signal $V_{B2}$ is smaller than the preset reference voltage signal $V_{ref}$, the comparator outputs a low-level control voltage $V_{EN}$ and a high-level control voltage $V_{blk}$ as the first switching signal; when the DC bias voltage signal $V_{B2}$ is greater than the preset reference voltage signal $V_{ref}$, the comparator outputs a high-level control voltage $V_{EN}$ and a low-level control voltage $V_{blk}$ as the second switching signal.

14. The blocking signal cancellation low noise amplifier system as claimed in claim 1, further comprising a buffer for receiving an output signal of the second low noise amplifier, wherein an output of the buffer serves as an output of the blocking signal cancellation low noise amplifier system.

15. The blocking signal cancellation low noise amplifier system as claimed in claim 2, wherein the blocking signal extraction and bias generation circuit comprises an envelope detection circuit and a DC signal extraction circuit;

the envelope detection circuit detects an envelope of the output signal of the first low noise amplifier, and outputs a signal that is inversely related to a magnitude of the envelope; and the DC signal extraction circuit is used to extract a DC voltage signal from an output signal of the envelope detection circuit as the DC bias voltage signal $V_{B2}$.

16. The blocking signal cancellation low noise amplifier system as claimed in claim 3, wherein the blocking signal extraction and bias generation circuit comprises an envelope detection circuit and a DC signal extraction circuit;

the envelope detection circuit detects an envelope of the output signal of the first low noise amplifier, and outputs a signal that is inversely related to a magnitude of the envelope; and the DC signal extraction circuit is used to extract a DC voltage signal from an output signal of the envelope detection circuit as the DC bias voltage signal $V_{B2}$.

17. The blocking signal cancellation low noise amplifier system as claimed in claim 4, wherein the blocking signal extraction and bias generation circuit comprises an envelope detection circuit and a DC signal extraction circuit;

the envelope detection circuit detects an envelope of the output signal of the first low noise amplifier, and outputs a signal that is inversely related to a magnitude of the envelope; and the DC signal extraction circuit is used to extract a DC voltage signal from an output signal of the envelope detection circuit as the DC bias voltage signal $V_{B2}$.

18. The blocking signal cancellation low noise amplifier system as claimed in claim 5, wherein the blocking signal extraction and bias generation circuit comprises an envelope detection circuit and a DC signal extraction circuit;

the envelope detection circuit detects an envelope of the output signal of the first low noise amplifier, and outputs a signal that is inversely related to a magnitude of the envelope; and the DC signal extraction circuit is used to extract a DC voltage signal from an output signal of the envelope detection circuit as the DC bias voltage signal $V_{B2}$.

\* \* \* \* \*